United States Patent
Kim

(10) Patent No.: US 9,852,788 B2
(45) Date of Patent: Dec. 26, 2017

(54) MULTIPAGE PROGRAM SCHEME FOR FLASH MEMORY

(71) Applicant: Conversant Intellectual Property Management Inc., Ottawa (CA)

(72) Inventor: Jin-Ki Kim, Ottawa (CA)

(73) Assignee: CONVERSANT INTELLECTUAL PROPERTY MANAGEMENT INC., Ottawa (CA)

( * ) Notice: Subject to any disclaimer, the term of this patent is extended or adjusted under 35 U.S.C. 154(b) by 0 days.

(21) Appl. No.: 15/266,196

(22) Filed: Sep. 15, 2016

(65) Prior Publication Data

US 2017/0004877 A1    Jan. 5, 2017

Related U.S. Application Data

(63) Continuation of application No. 13/186,789, filed on Jul. 20, 2011, now Pat. No. 9,484,097.

(60) Provisional application No. 61/366,375, filed on Jul. 21, 2010.

(51) Int. Cl.
    *G11C 16/10* (2006.01)
    *G11C 11/56* (2006.01)
    *G11C 16/04* (2006.01)

(52) U.S. Cl.
    CPC ...... *G11C 11/5628* (2013.01); *G11C 16/0483* (2013.01); *G11C 16/10* (2013.01)

(58) Field of Classification Search
    CPC . G11C 11/5628; G11C 16/10; G11C 16/0483; G11C 11/5621
    See application file for complete search history.

(56) References Cited

U.S. PATENT DOCUMENTS

| | | | | |
|---|---|---|---|---|
| 6,714,457 B1 * | 3/2004 | Hsu | ...... | G11C 11/5628 365/185.03 |
| 2008/0049497 A1 * | 2/2008 | Mo | ...... | G11C 11/5628 365/185.03 |

* cited by examiner

*Primary Examiner* — Douglas King
(74) *Attorney, Agent, or Firm* — Shin Hung; Borden Ladner Gervais LLP

(57) ABSTRACT

A circuit and method for programming multiple bits of data to flash memory cells in a single program operation cycle. Multiple pages of data to be programmed into one physical page of a flash memory array are stored in page buffers or other storage means on the memory device. The selected wordline connected to the cells to be programmed is driven with predetermined program profiles at different time intervals, where each predetermined program profile is configured for shifting an erase threshold voltage to a specific threshold voltage corresponding to a specific logic state. A multi-page bitline controller biases each bitline to enable or inhibit programming during each of the time intervals, in response to the combination of specific logic states of the bits belonging to each page of data that are associated with that respective bitline.

13 Claims, 25 Drawing Sheets

MULTIPAGE PROGRAM SCHEME FOR FLASH MEMORY

CROSS REFERENCE TO RELATED APPLICATIONS

This application is a continuation of U.S. patent application Ser. No. 13/186,789, filed on Jul. 20, 2011, which claims the benefit of priority of U.S. Provisional Patent Application Ser. No. 61/366,375 filed on Jul. 21, 2010, which are incorporated herein by reference.

TECHNICAL FIELD

The present invention relates to generally a semiconductor device and in particular to programming multiple bits of data to a single flash memory cell.

BACKGROUND

Flash memory is a commonly used type of non-volatile memory in widespread use as mass storage for consumer electronics, such as digital cameras and portable digital music players for example. The density of a presently available flash memory chip can be up to several Gbytes (GB) in size, which is suitable for use in popular USB flash drives since the size of one flash chip is small. Another emerging application for flash memory are solid state drives for replacing traditional hard disk drives used in laptop and desktop computers.

FIG. 1 is a general block diagram of typical flash memory device known in the art. Flash memory device 10 includes input/output interface circuits, control circuits, memory circuits and a memory array. The input/output interface circuits of flash memory device 10 include a Ready/Busy signal buffer 12, control signal buffers 14 and global data buffers 16. The Ready/Busy signal buffer 12 is an output buffer which drives the Ready/Busy signal R/B# via a respective pin or port. In the present example, the control signal buffers 14 are input buffers which receive flash memory control signals CE#, CLE, ALE, WE#, RE# and WP# from corresponding pins or ports. Signal names ending with "#" should be understood from this point forward as being active low level signals, where an active low signal corresponds to a "0" logic level, or a VSS voltage level for example. In contrast, an active high logic level signal corresponds to a "1" logic level, or a VDD or VCC voltage level for example. Following is a short description of the previously mentioned control signals.

Command Latch Enable (CLE): the CLE input signal is used to control loading of the operation mode command into the internal command register. The command is latched into the command register from the I/O port on the rising edge of the WE# signal while CLE is High.

Address Latch Enable (ALE): the ALE signal is used to control loading address information into the internal address register. Address information is latched into the address register from the I/O port on the rising edge of the WE# signal while ALE is High.

Chip Enable (CE#): the device goes into a low-power Standby mode when CE# goes High during the device is in Ready state. The CE# signal is ignored when device is in Busy state (R/B#=L), such as during a Program or Erase or Read operation, and will not enter Standby mode even if the CE# input goes High.

Write Enable (WE#): the WE# signal is used to control the acquisition of data from the I/O port.

Read Enable (RE#): the RE signal controls serial data output. Data is available after the falling edge of RE#. The internal column address counter is also incremented (Address=Address+I) on this falling edge.

I/O Port (I/O0 to 7): I/O0 to 7 pins are used as a port for transferring address, command and input/output data to and from the device.

Write Protect (WP#): the WP# signal is used to protect the device from accidental programming or erasing. The internal voltage regulator (high voltage generator) is reset when WP# is Low. This signal is usually used for protecting the data during the power-on/off sequence when input signals are invalid.

Ready/Busy (R/B#): the R/B# is open drain pin and the output signal is used to indicate the operating condition of the device. The R/B# signal is in Busy state (R/B#=L) during the Program, Erase and Read operations and will return to Ready state (R/B#=H) after completion of the operation.

The global data buffers 16 in the present example of FIG. 1 are bi-directional buffers which receive write data and provide read data on respective input/output (I/O) pins or ports. The flash memory device 10 is shown to have 8 such ports I/O0 to I/O7, but can have more or less than 8 in alternate data width configurations. These I/O ports are also used for receive address and command information.

The control circuits of flash memory device 10 include controller 18, command register 20, address register 22 and status register 24. Controller 18 controls various functions of the other circuits in flash memory device 10, where such functions include read, program and program verification. While not shown, the controller 18 can include a command decoder for executing the functions in response to a received command. The registers store types of information received by flash memory device 10 or to be provided to an external host system, including a memory controller for example. The described registers are not intended to be exhaustive, and other registers can be included, such as data registers for example.

The circuits primary controlled by controller are the memory circuits, which include row and column pre-decoders 26 and 28, row and column decoders 30 and 32, sense amplifiers and page buffer block 34, and a high voltage generator 36. The memory array 38 of flash memory device 10 consists of NAND cell strings connected to bitlines, where each memory cell of a NAND cell string is connected to a wordline. Further details of a NAND cell string is shown later in FIG. 3. The row pre-decoder 26, row decoder 30 and high voltage generator 36 are controlled in a programming operation to drive a selected wordline to a high voltage effective for shifting a threshold voltage of the connected memory cell from a default erased threshold voltage to a desired voltage level. It is noted that a high voltage may be used in the memory array 38 to erase memory cells by shifting their threshold voltages to the default value. Different combinations of high voltages and applied time of the high voltages can be used to set specific threshold voltages for a flash memory cell. A combination for programming a specific threshold voltage can be referred to as a programming profile. The page buffer 34 stores a page of data to be programmed to the cells connected to the selected wordline. Generally, a memory cell connected to a bitline is either inhibited from being programmed or enabled for programming via the selected wordline, depending on the logic level the bitline is biased, or set to. The data bits stored in the page buffer are used to bias the bitline.

FIG. 2 is a threshold voltage distribution graph for a single bit flash memory cell, which stores one of two possible levels or states, State 0 or State 1. This is also referred to as single level cell (SLC) memory. In FIG. 2, State 0 is the default erased state of all flash memory cells of memory array 38, which in this example is a negative threshold voltage. In contrast, State 1 corresponds to a positive threshold voltage. Therefore when erased, the flash memory cells stores the "1" logic state for a single bit of stored data. Programming is then executed to shift the erased threshold voltage to the positive voltage of State 1 if the data to be stored in a selected cell corresponds to a "0", which as previously explained is done by driving the selected wordline connected to the cell with a particular programming profile.

FIG. 3 is a circuit schematic showing a portion of memory array 38 of FIG. 1, and in particular shows NAND cell strings connected to two bitlines BL1 and BLj. Each NAND cell string has flash memory cells 50 serially coupled arranged and electrically coupled to each other. Accordingly, wordlines WL0 to WLi are coupled to the gates of each flash memory cell 50 in the memory cell string. Place holders "i" and "j" are integer values, designating a last wordline and bitline respectively. A string select device 52 coupled to signal SSL (string select line) selectively connects the memory cell string to a bitline (BL1 or BLj), while a ground select device 54 coupled to signal GSL (ground select line) selectively connects the memory cell string to a source line, such as VSS. The string select device 52 and the ground select device 54 are n-channel transistors. The two NAND cell strings shown in FIG. 3 connected to the same wordlines, SSL and GSL are part of one memory block 56. Accordingly, there can be multiple memory blocks connected to the same bitlines BL1 to BLj in parallel to the memory block shown in FIG. 1.

If flash memory cells 50 store a single bit of data, then all the cells 50 connected to the same wordline store a page of data. In FIG. 3 by example, the cells connected to WL0 are collectively referred to physical Page 0, while the cells connected to WLj are collectively referred to as physical Page i, where each stores one page of data.

Coupled to each bitline BL1 to BLj is a page buffer 58 for storing one page of data to be programmed into one page of flash memory cells. Page buffer 58 also includes sense circuits for sensing data read from one page of flash memory cells. During programming operations, the data registers perform program verify operations to ensure that the data has been properly programmed into the flash memory cells coupled to the selected wordline. Therefore, each row of cells stores a page of data. To achieve improved density, each flash memory cell can store at least two bits of data, and is generally referred to as a multi-bit-cell (MBC). In storing at least two bits of data per cell, the storage density of a memory array is at least doubled relative to the same memory array having cells that store only one bit of data.

FIG. 4 is a threshold voltage distribution graph for a two-bit flash memory cell. This is also referred to as multiple level per cell (MLC) memory. FIG. 4 shows four possible states, State 0, State 1, State 2 and State 3, which can be stored by a two-bit flash memory cell. As shown by example in FIG. 4, each state corresponds to a combination of two bits of data. State 0 can represent binary values "11", State 1 can represent binary values "10", State 2 can represent binary values "00", and State 3 can represent binary values "01". The binary values shown in FIG. 4 are example combinations, and the assignment of binary value combinations for each state can differ from those presently shown in FIG. 4. Accordingly, a row of flash memory cells connected to the same wordline can now store two pages of data, instead of the single page of data for the single bit flash memory cell. The logical organization of these two pages of data, referred to as logical pages, associated with cells connected to a common wordline, referred to as a physical page, is now described.

FIG. 5 is an illustration showing storage of lower and upper pages of data stored in rows of two-bit flash memory cells. In FIG. 5, flash memory cells 70 and 72 are part of a first NAND cell string, flash memory cells 74 and 76 are part of a second NAND cell string, flash memory cells 78 and 80 are part a last NAND cell string, representing the last NAND cell string in a memory block. Depending on the configuration of the block, there can be a plurality of intervening NAND cell strings between the second NAND cell string and the last NAND cell string. Each of the flash memory cells has one of the four possible logic states shown in FIG. 4, with the corresponding two-bit binary value assignments. In the example of FIG. 5, cell 70 stores State 3, cell 72 stores State 1, cell 74 stores State 1, cell 76 stores State 3, cell 78 stores State 2, and cell 80 stores State 0. The binary values are shown in each cell, where the upper bit corresponds to the left-most bit in the corresponding state of FIG. 4 and the lower bit corresponds to the right-most bit. The flash memory cells 72, 76 and 80 connected to wordline WL0 correspond to a physical page having lower bits of flash memory cells 72, 76 and 80 correspond to logical page 0, while the upper bits correspond to logical page 1. Similarly, the flash memory cells 70, 74 and 78 connected to wordline WLi correspond to another physical page having lower bits corresponding to logical page k-1, while the upper bits correspond to a last logical page k. Therefore, it can be seen how each physical page stores two pages of data.

By extension, if each flash memory cell can store 3 bits of data, then each cell can store $2^3=8$ states, which means that each physical page can store up to 8 pages of data. Provided all the different states can be programmed and sensed during a read operation, the increase in storage density without the need for increasing the physical memory array size affords significant advantages for mass storage applications. Unfortunately, the time required for programming two pages of data (two bits per cell) per physical page is significantly increased relative to programming a single page of data per physical page. This increased programming time is further exacerbated if 3 or more bits per cell storage is used.

While the time required for occasionally copying several small data files to a USB drive capable of multiple bit per cell storage may not appear inconvenient for users, the frequent writing of a large number of small data files will noticeably take a longer amount of time. Frequent writing of smaller data files is common in solid state hard disk drives, which can impose a performance limitation on the computer system it is used within. Storage of larger data files such as music and video files to flash memory capable of storing multiple bits per cell will take a very noticeable duration of time to program.

As flash memories are widely used in computing applications such as Sods and flash cache, higher performance flash memories are desired. It should be noted that high performance operation can be obtained with one or more of higher I/O bandwidth, higher read and write throughput and higher flexibility of operations. Moreover flash storage systems for computing applications require higher memory capacity without diminishing performance.

It is therefore desirable to reduce the time required for programming cells storing two or bits of data, to thereby improve overall performance of the system it is used within.

SUMMARY

In accordance with a first aspect, there is provided a multi-page programming method for a NAND flash memory device. The method includes storing M pages of data in the NAND flash memory device, where M is an integer value greater than 1, and initiating a multi-page programming operation in the NAND flash memory device for storing up to 2M states in memory cells of the NAND flash memory device. According to one embodiment of the present aspect, the method can further include checking a completion status of the multi-page programming operation and determining if the multi-page programming operation was successful when the completion status corresponds to a completed multipage programming operation. According to a nether embodiment of the present aspect, storing can include iteratively loading each of the M pages of data into respective M page buffers of the NAND flash memory device, where loading each of the M pages of data can include receiving at the NAND flash memory device, a data load command followed by input data. In the present embodiments, the input data includes the data and address information. Also in the present embodiments, the data load command is a first data load command, and a second data load command is received after the input data corresponding to the 1st data load command is received. In this embodiment, a data end command is received after the input data corresponding to the first data load command is received and before the second data load command is received. Alternately, a data end command for a last page of the M pages of data is received after input data corresponding to the last page of the M pages of data is received, where the data end command includes a multi-page program command.

In another embodiment, the multi-page programming operation includes executing $2^M-1$ programming iterations to program up to $2^M-1$ states and one of the $2^M$ states is an erased state. Each programming iteration includes biasing each of the bitlines to enable or inhibit programming in response to a combination of bits of the M pages of data that correspond to each bitline. Furthermore, each programming iteration includes driving a selected wordline with a programming profile specific to each programming iteration while the bit lines are biased to enable or inhibit programming.

In a second aspect, there is provided a flash memory device. The flash memory device includes a memory array, bitline access circuitry and row circuits. The memory array has flash memory cells connected to wordlines and coupled to bitlines. The bitline access circuitry stores M pages of data and biases the bitlines to enable or inhibit programming for each of $2^M-1$ programming iterations in response to a combination of bits corresponding to each bitline from the M pages of data, where M is an integer number of at least 2. The row circuits drive a selected wordline with a programming profile for each of the $2^M-1$ programming iterations while the bitlines are biased to enable or inhibit programming. According to an embodiment of the 2nd aspect, the bitline access circuitry includes M data buffers each for storing one of the M pages of data, and bitline biasing circuitry for biasing each of the bitlines to enable or inhibit programming in response to a combination of bits of the M pages of data stored in the M data buffers that correspond to each bitline. In this embodiment, each of the M data buffers includes data storage circuits for storing one bit of a page of data, and each bit position of the M data buffers includes a data verify decoder and inversion circuitry. The data verify decoder receives the bits of the M pages of data stored in the M data buffers that correspond to each bitline. The inversion circuitry inverts the bits in response to selected outputs of the data decoder.

In a third aspect, there is provided a flash memory device. The flash memory device includes a memory array, a bitline access circuit, and row circuits. The memory array has flash memory cells connected to wordlines and coupled to bitlines, where each flash memory cell is programmable to have a threshold voltage corresponding to one of an erase state, a first state, a second state and a third state. The bitline access circuit biases the bitlines to program the first state, the second state and the third state in a predetermined order. The bitline access circuit biases the bitlines to enable or inhibit programming for each of the first state, the second state and the third state in response to specific combinations of bits from two pages of data. The row circuits drive a selected wordline with programming profiles corresponding to the first state, the second state and the third state while the bitline is biased for programming the first state, the second state and the third state respectively.

In a fourth aspect, there is provided a method for programming a flash memory device. The method includes loading at least two pages of data into page buffers of the flash memory device; biasing bitlines of the flash memory device; and driving a wordline of the flash memory device. The bitlines of the flash memory device are biased to voltage levels effective for one of inhibiting programming and enabling programming of different threshold voltages to flash memory cells coupled to the bitlines in response to logic states of data bits of the at least two pages of data. The word line is driven for a period of time for programming the different threshold voltages to the flash memory cells that are connected to the wordline in parallel.

In a fifth aspect, there is provided a method for programming different states to a plurality of flash memory cells in parallel. The method includes receiving M bits of data for each of the flash memory cells, where M is an integer value of at least 2; determining one state of $2^M$ possible states to store in each of the plurality of flash memory cells in response to the M bits of data; biasing bit lines connected to the plurality of flash memory cells with predetermined voltage levels, where each predetermined voltage level corresponds to each of the $2^M$ possible states; and driving a selected word line for programming up to $2^M$ different states in the plurality of flash memory cells in parallel.

In a sixth aspect, there is provided a bitline modulator circuit for multi-state programming of pages of data to a physical page of flash memory cells. The bitline modulator circuit includes a program data decoder and a bitline biasing circuit. The program data decoder receives M bits of data and provides decoded selection signals in response to a logic combination of the M bits of data, where M is an integer number of at least 2 and each of the M bits of data is associated with one of the pages of data. The bitline biasing circuit biases a bitline to one of $2^M$ voltage levels in response to the decoded selection signals.

In a seventh aspect, there is provided a flash memory device. The flash memory device includes a memory array, M page buffers, bitline modulators and row circuits. The memory array has flash memory cells connected to wordlines and coupled to bitlines. The M page buffers store M pages of data, where M is an integer number of at least 2. The bitline modulators are coupled to each of the bitlines and to the M page buffers. Each of the bitline modulators applies one of $2^M$ voltage levels to a corresponding bitline in response to a combination of data bits from each of the M pages of data. The row circuits drive a selected wordline with a programming profile to program the M pages of data to a row of flash memory cells.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

The present invention generally relates to methods to program multiple logical pages of data to one physical page of cells in a single programming cycle in flash memory. In particular, a circuit and method for programming multiple bits of data to flash memory cells in a single program operation cycle are described. Multiple pages of data to be programmed into one physical page of a flash memory array are stored in page buffers or other storage means on the memory device. The selected wordline connected to the cells to be programmed is driven with predetermined program profiles at different time intervals, where each predetermined program profile is configured for shifting an erase threshold voltage to a specific threshold voltage corresponding to a specific logic state. The bit lines are biased to specific states during each of the time intervals, in response to the combination of specific logic states of the bits belonging to each page of data that are associated with that respective bitline.

Preferred embodiments are implemented in NAND flash memory although the present invention may be applicable to other type of flash memory such as, for example, NOR flash memory.

Figure 5:
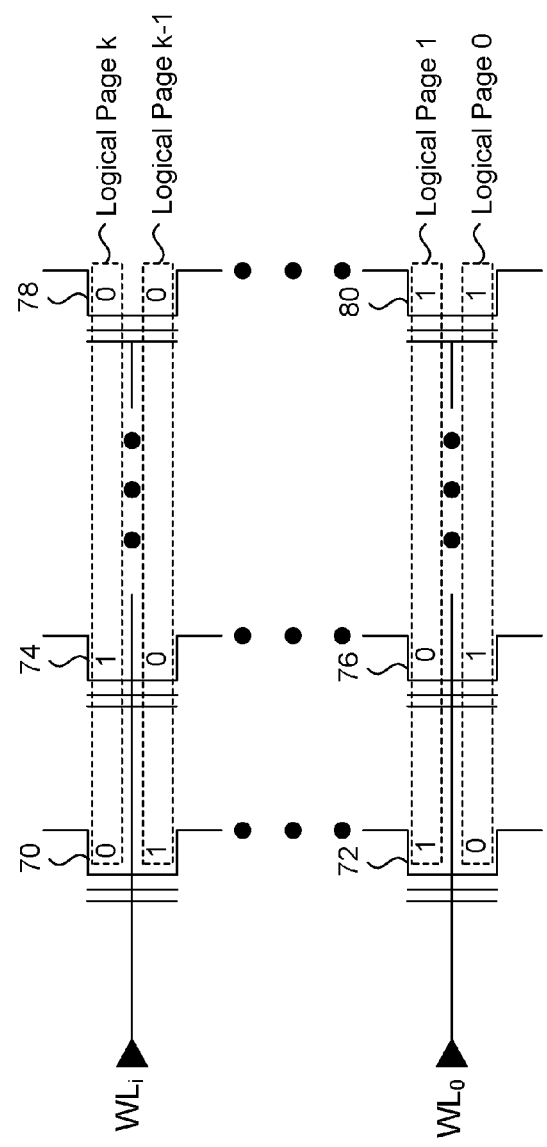
FIG. 5 is an illustration showing storage of lower and upper pages of data stored in two-bit flash memory cells.

Prior to a discussion of the embodiments, current MLC programming schemes will now be described. A common MLC flash memory architecture is the 2 bit per cell flash memory. Therefore, current 2 bit per cell programming schemes are described. In a 2 bit per cell scheme, each wordline within a NAND cell string is decoded into two logical pages as a first page (a lower page) and a second page (an upper page). With reference to FIG. 5, logical page 0 can be a lower page while logical page 1 can be an upper page. In this example, the lower page is first programmed, followed by programming of the upper page. This sequence is illustratively shown in FIGS. 6A and 6B.

Figure 6A:
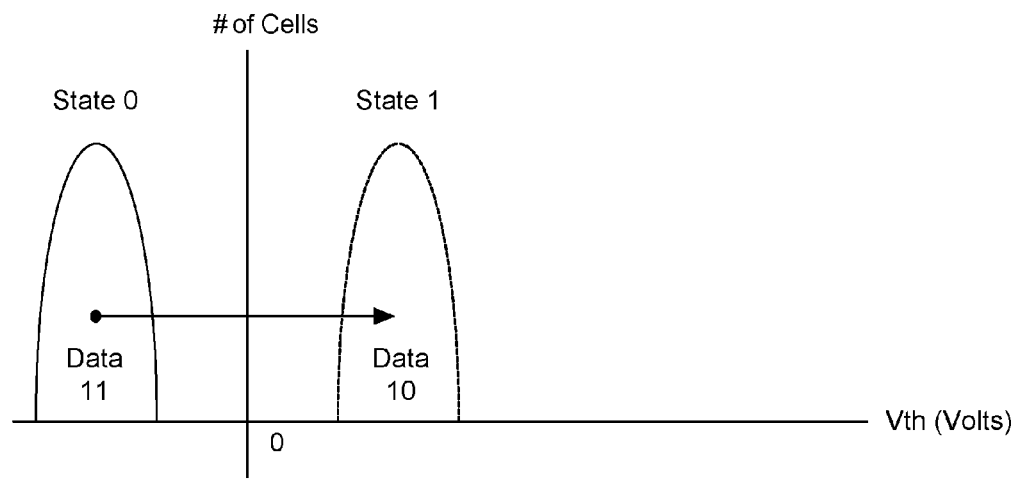
FIGS. 6A and 6B are graphical illustrations showing a sequence for programming two-bit per cell data using two programming operations in NAND flash.
Figure 6B:
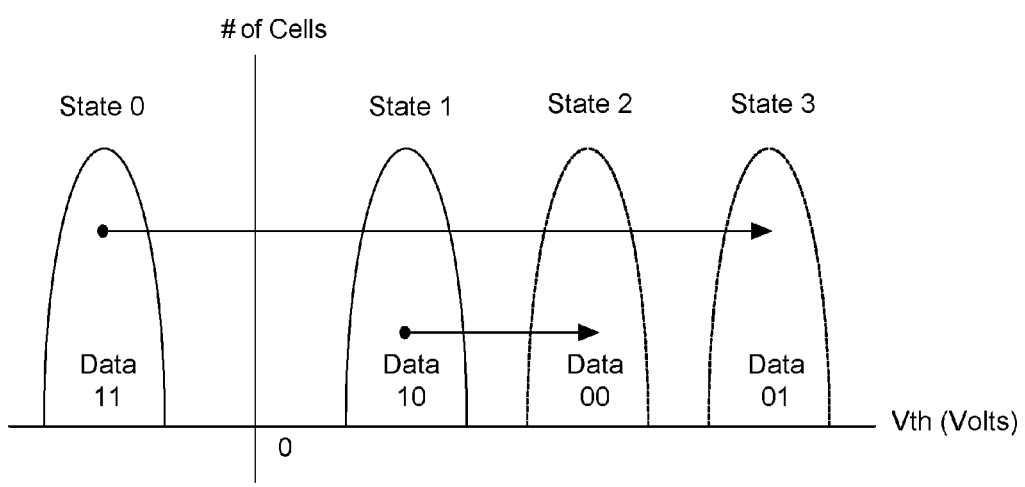

FIG. 6A is a threshold voltage distribution graph showing logic states corresponding to a first bit of data (1 or 0) to be stored in a 2 bit flash memory cell. Prior to programming, all cells of a memory block are erased. FIG. 6A shows the erased state to be State 0, which in the present example is a negative threshold voltage. In a first program operation cycle, the bit corresponding is programmed to State 1, or it remains at State 0 depending on the logic state of the bit to be stored. FIG. 6B is another threshold voltage distribution graph showing the possible sequence for programming a second bit of data (1 or 0), also referred to as the bit of the upper page, to the cell programmed in FIG. 6A. In a subsequent programming cycle, this second bit corresponding to the upper page is programmed. The logic state of this second bit determines if and how State 2 and State 3 are programmed. If for example State 0 and State 1 have the binary assignments shown in FIG. 4, and the second bit to be programmed (left-most bit) is a logic 1, then there is no need to program State 2 or State 3 because both State 0 and State 1 have an upper bit assigned to a logic 1. On the other hand, programming of State 2 or State 3 is required if the second bit to be programmed is a logic 0.

Figure 7:
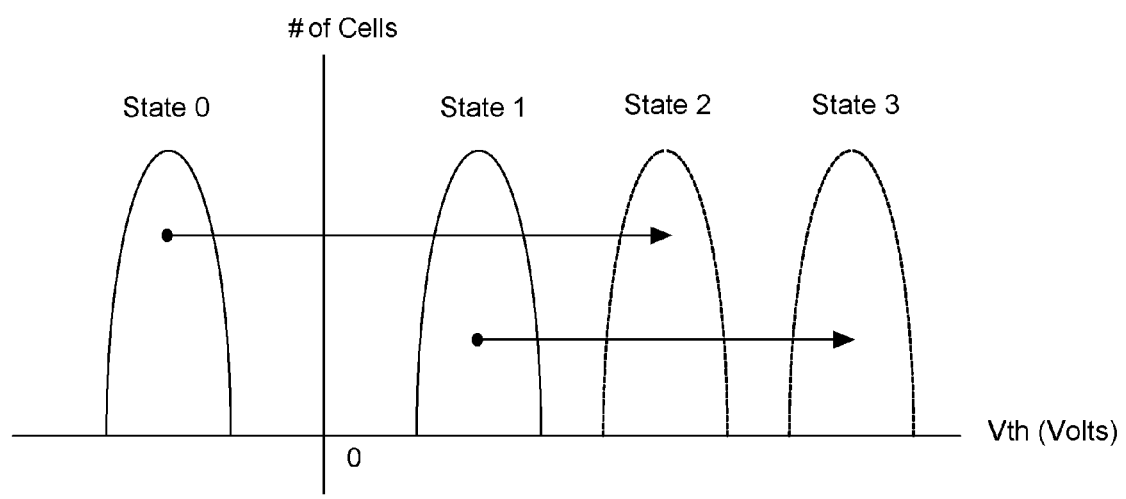
FIG. 7 illustrates an alternate sequence for programming two-bit per cell data using two programming operations in NAND flash.

In programming State 2 or State 3 of the present example, the logic state of the originally programmed lower bit is retained. Therefore, as shown in FIG. 6B, the threshold voltage corresponding to State 0 is shifted to the threshold voltage corresponding to State 3 or the threshold voltage corresponding to State 1 is shifted to the threshold voltage corresponding to State 2. Therefore, the shown logic states State 0 to State 3 encode the different logic combinations of the upper and lower bits. FIGS. 6A and 6B shows a two cycle programming scheme for programming two bits of data per cell. FIG. 7 shows an threshold voltage distribution graph illustrating an alternate two cycle programming scheme to show that threshold voltages can be shifted to different levels, depending on the bit assignments for each logic state. In both shown examples, two separate programming cycles are required for programming two bits per cell. Each programming cycle involves receiving a command with address information and the page of data, and having the memory device program the first page of data followed by a program verify operation to ensure that the data bits have been properly programmed.

It should be noted that in conventional MLC NAND flash memory configured for two bit data storage per physical page, the total page program time for the lower page and upper page are different. Typically the page program time for the lower page is approximately 30% faster than the page program time for the upper page due to the following reasons. The lower page programming cycle requires only cell programming from State 0 to State 1, but the upper page programming cycle further includes a read operation of the lower page data in order to determine which of State 2 or State 3 programming is required. Furthermore, the programming profiles for State 2 and State 3 are more elaborate and take more time than programming of State 1. Therefore, programming multiple pages to one physical page in an MLC memory will take a significantly longer amount of time when compared to programming the same number of multiple pages to their own physical pages in an SLC memory.

It is known to those skilled in the art that subjecting flash memory cells to longer programming times can degrade the gate oxides of the cells, thereby reducing their reliability. This problem is compounded by the continued scaling down of process technologies. With smaller feature sizes and thinner gate oxides, program throughput degradation due to longer programming time becomes a serious problem. In addition, program stresses become significant issues which affect device reliability and shorten the device lifetime.

In order to address the disadvantages of current multiple page programming schemes, a circuit and method for programming multiple bits of data to flash memory cells in a single program operation cycle are described. Multiple pages of data to be programmed into one physical page of a flash memory array are stored in page buffers or other storage means on the memory device. The selected wordline connected to the cells to be programmed is driven with predetermined program profiles at different time intervals, where each predetermined program profile is configured for shifting an erase threshold voltage to a specific threshold voltage corresponding to a specific logic state. The bit lines are biased to voltage levels effective for either enabling or inhibiting programming of the memory cell connected to the selected wordline being driven during each time interval. The specific voltage level to apply to the bit lines depends on the combination of specific logic states of the bits belonging to each page of data that are associated with that respective bitline. The embodiments can be applied to m bit per cell MLC memory, where m can be any integer number. It is noted that reference to an m bit per cell MLC memory means that each physical page of cells can store m logical pages.

Figure 1:
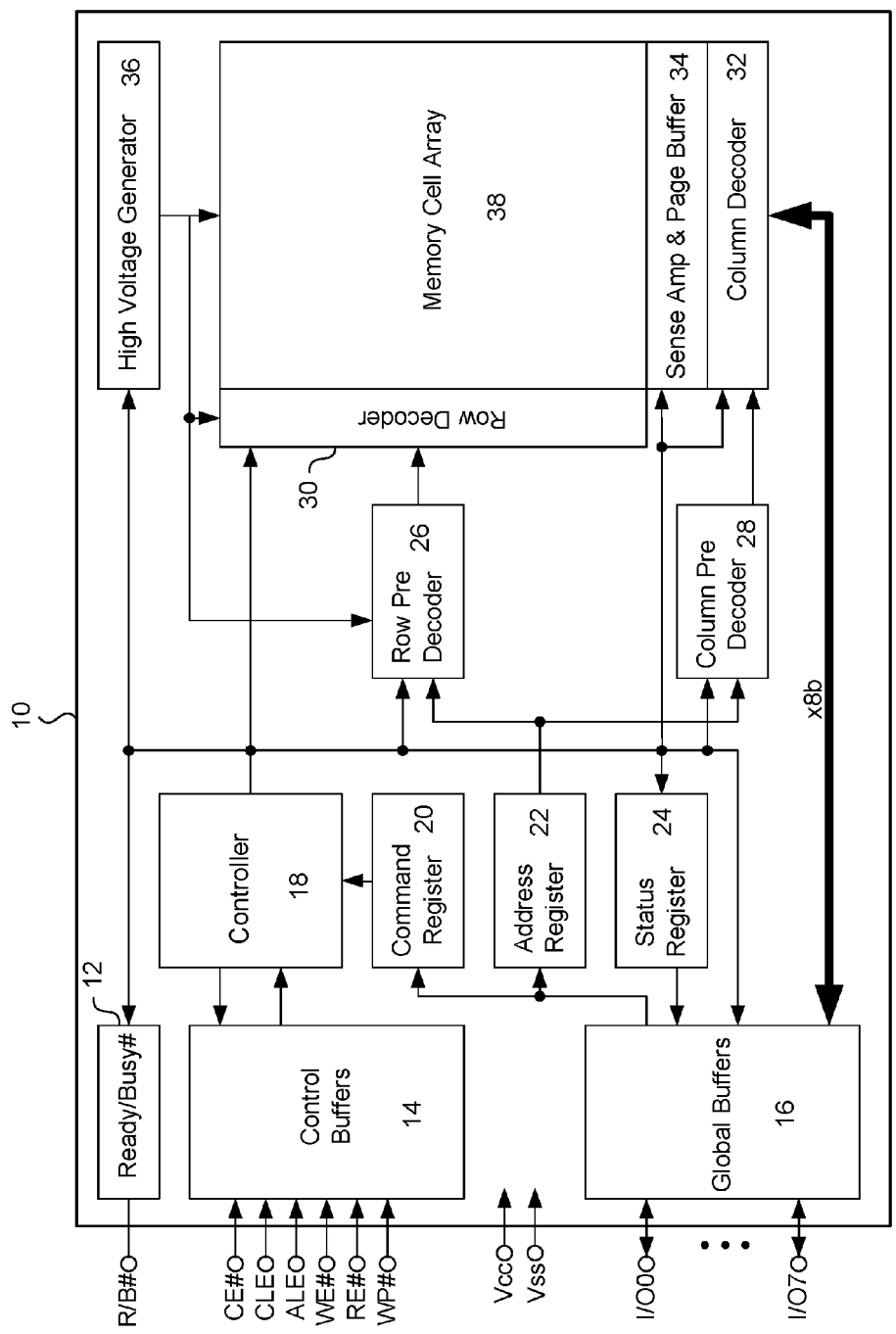
FIG. 1 is a functional block diagram of a NAND flash memory device.
Figure 2:
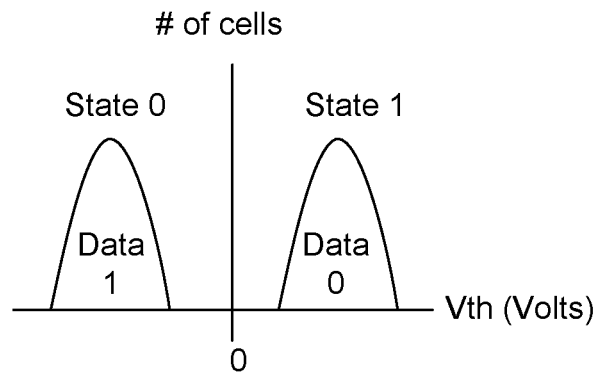
FIG. 2 is a threshold voltage distribution graph for a single bit flash memory cell.
Figure 3:
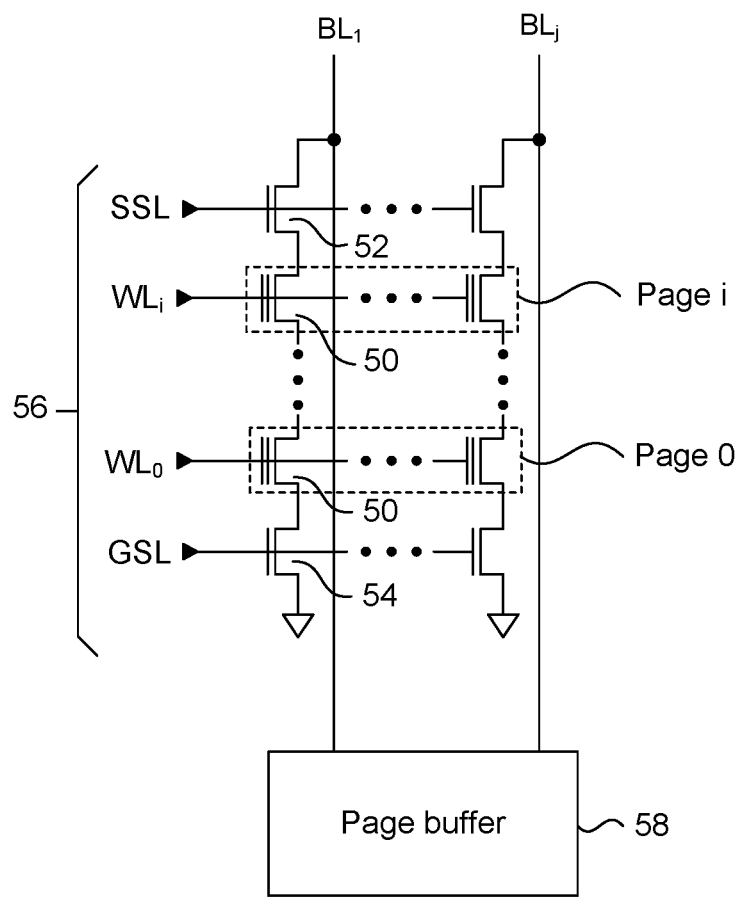
FIG. 3 is a circuit schematic showing NAND cell strings of a NAND flash memory array.
Figure 8:
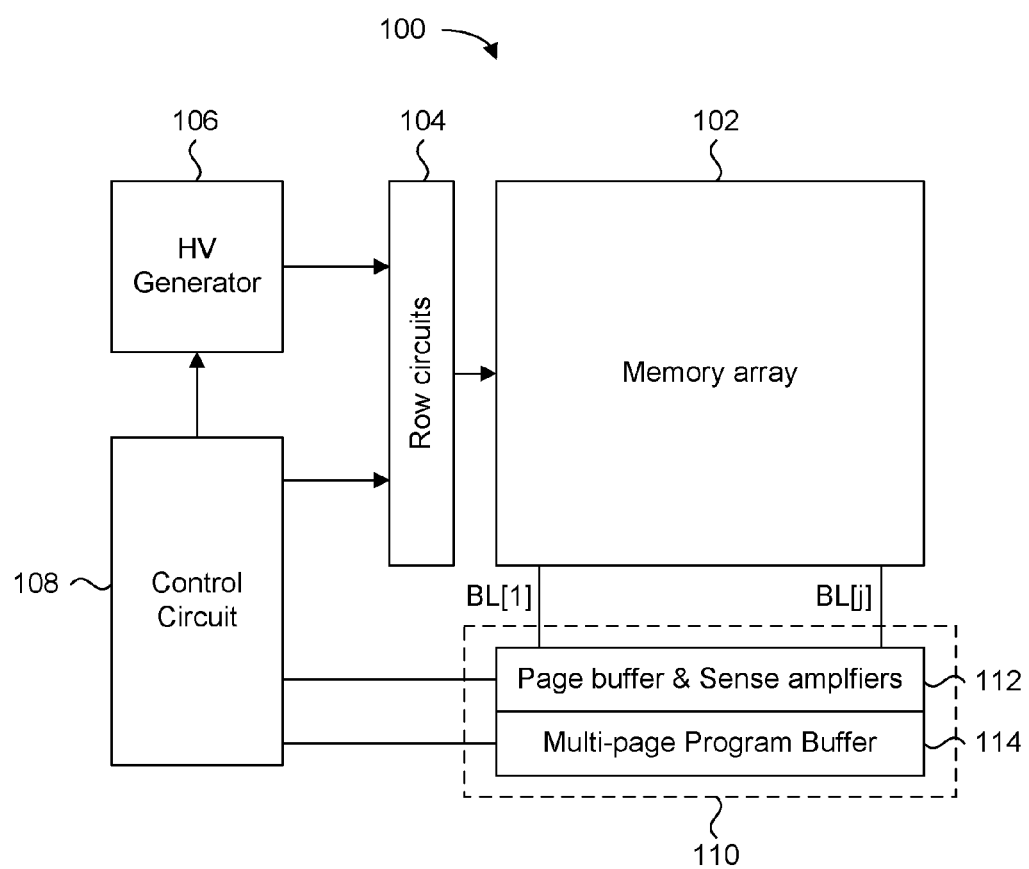
FIG. 8 is a block diagram of a multi-page programmable NAND flash memory, according to a present embodiment.

FIG. 8 is a block diagram of a flash memory device, according to a present embodiment. FIG. 8 is limited to showing the circuit blocks which are used for the presently described multi-page programming embodiments. Persons skilled in the art should understand that the omitted circuit blocks may include those shown earlier in FIG. 1. The memory device of FIG. 8 stores multiple pages of data, and programs the pages to a selected physical page in a single program cycle.

Memory device 100 includes a memory array 102, row circuits 104, a high voltage generator 106, a control circuit 108 and bitline access circuitry 110. Memory array 102 includes flash memory cells, arranged with a NAND cell string configuration or a NOR configuration, coupled to bitlines and wordlines. Memory array 102 has bitlines BL[1] to BL[j], where BL[j] is the last bitline in the memory array and j is an integer number. The memory array 100 can be organized as banks or sub-arrays. Row circuits 104 includes address decoding circuits such as bank, block and row address decoders for selecting a wordline, and drivers for applying various voltages to the wordlines during read, program and erase operations. The high voltage generator 106 provides one or more positive and/or negative voltages greater than the externally provided supply voltage to the row circuits. These high voltages can be provided to other circuits of memory device 100. The control circuit 108 is responsible for executing the various algorithms of flash memory device 100, and asserting control signals with appropriate timing for controlling the circuits of flash memory device 100. In particular, the control circuit 108 includes logic configured to coordinate control of the row circuits 104 and the bitline access circuitry 110 for multi-page programming, according to the present embodiments.

According to the present embodiments, the bitline access circuitry 110 biases each bitline to program all possible states of the memory cell connected to it in a predetermined order at different times and in conjunction with the wordline being driven with a specific programming profile. Each bitline is biased for enabling or inhibiting programming at a particular time in response to specific combinations of bits from corresponding bit positions of the pages of data stored in the memory device 100. These pages of data are stored in the bitline access circuitry 110. The bitline access circuitry 110 includes a page buffer 112, and at least one multi-page program buffer 114. The page buffer 112 can be any well known page buffer having circuits such as sense amplifiers, column decoding circuits and program verify logic. Alternately, data registers can be used for storing pages of the data to be programmed. Page buffer 112 is used for storing a first page of data to be programmed. Bitline access circuitry 110 includes multipage programming logic circuitry to ensure that the memory cell connected to each bitline has been programmed to a final threshold voltage corresponding to a specific logic state.

In the present example, memory device 100 is configured for two bit per cell data storage, thus there is one multi-page program buffer 114 for storing a second page of data to be programmed. Additional multipage program buffers 114 can be included in alternate embodiments where more than 2 pages of data are to be stored in a physical page of memory device 100. Buffer 114 also includes column decoding logic for receiving a starting column address at which the first bit of second page of data is to be stored. Both page buffers 112 and 114 are the same size, where page buffer 112 stores data bits DATA1_[1] to DATA1_[j] of the first page of data, each corresponding to a respective bitline BL[1] to BL[j], where j is an integer number representing the last bit position of buffer 112. Page buffer 114 stores data bits DATA2_[1] to DATA2_[j] of the second page of data, each corresponding to a respective bitline BL[1] to BL[j].

Figure 9:
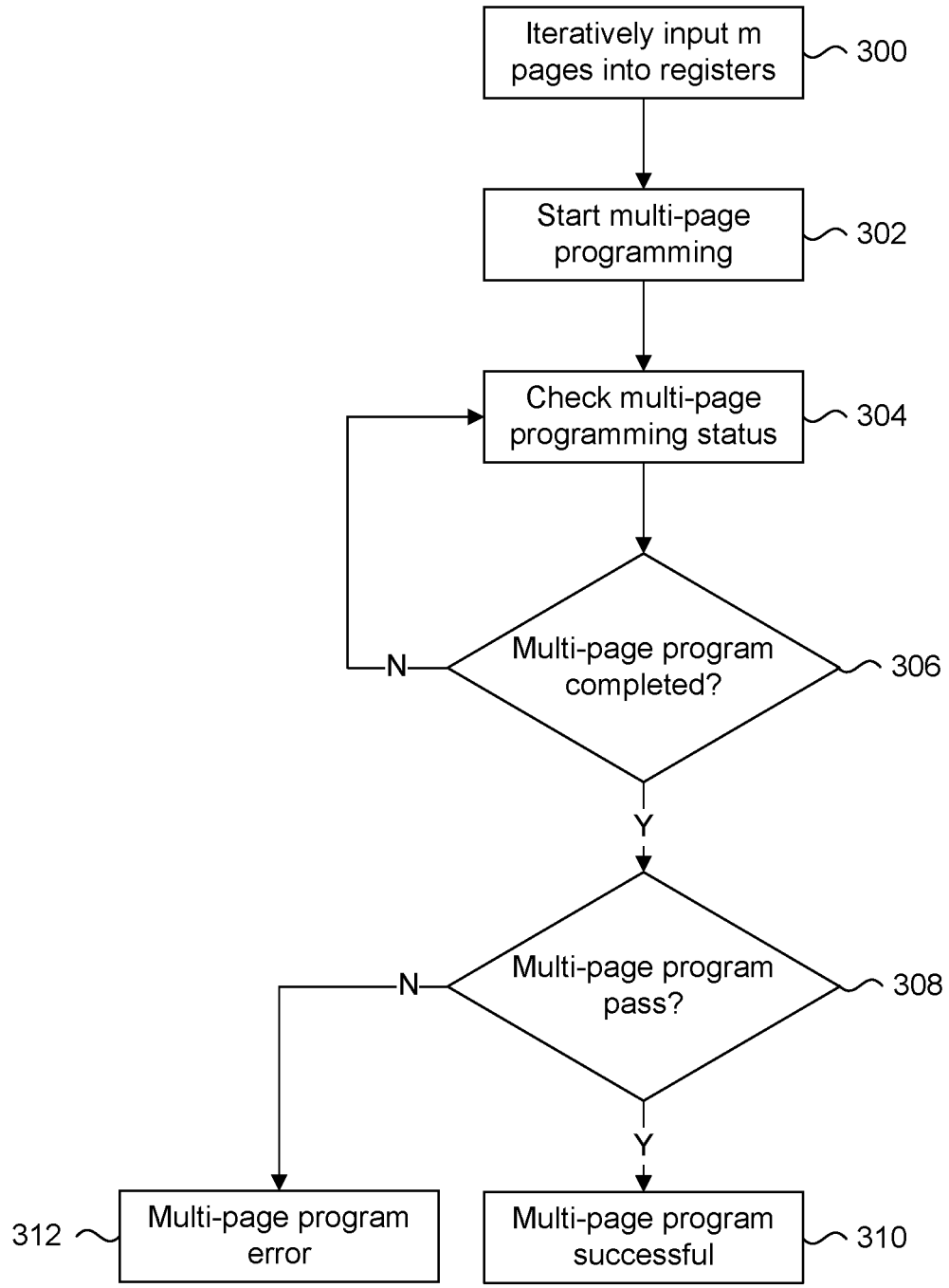
FIG. 9 is a flow chart of a method of operating a flash memory device for a multi-page program operation, according to a present embodiment.

Following is a discussion of a method of controlling a flash memory device configured for multipage programming, according to a present embodiment. FIG. 9 is a flow chart of a method of operating a flash memory device configured for the previously described multi-page program operation, which can be executed by a host system including but not limited to, a memory controller or computer system having memory controller functionality. An example flash memory device which can be controlled according to the presently described method can have the configuration shown in FIG. 8.

The method of FIG. 9 begins at 300 where up to m pages of data are iteratively loaded into the page buffers of the flash memory device, via an appropriate command recognized by the flash memory device. With reference to the circuit embodiment of FIG. 8 by example, a first page of data is stored in page buffer 112 and a second page buffer is stored in page buffer 114. At step 302, the multi-page programming operation is initiated in the flash memory device after all the pages of data to be programmed to one physical page have been loaded into the flash memory device. Initiation of the multi-page programming operation can be done via a command recognized by the flash memory device. Now the flash memory device executes internal operations to program the logical pages to the single physical page. The internal multipage programming operations of the memory device of the present embodiments, will be discussed in further detail later. The host system will poll the flash memory device at step 304 to check the programming status of the flash memory device, by way of a status request command. In response to the status request command, the flash memory device will output from its data output port a status bit indicating if the programming operation is completed or not. At step 306, the host system will determine if programming by the flash memory device is finished or not depending on the returned status signal. If programming is complete, then the method proceeds to step 308, otherwise the host system re-issues its status request later, and the method returns to step 304.

A determination of the success or failure of the multi-page programming operation of the flash memory device is made at step 308, which can be done through another request by the host system. In response to this request, the flash memory device can output another signal indicative of successful or failed multi-page programming. If programming was successful, then the method proceeds to step 310 and the host system can initiate another operation with the flash memory device, such as another multi-page program operation for example. On the other hand, if multi-page programming failed, then the method proceeds to step 312. At this point, the data can be reprogrammed to a different row address, or to a different flash memory device, or the host system simply provides notification that an error occurred and the data was not written to the flash memory device. It is noted that the status signals provided by the flash memory device are written to registers of the flash memory device, which can be outputted in response to specific commands.

Figure 10:
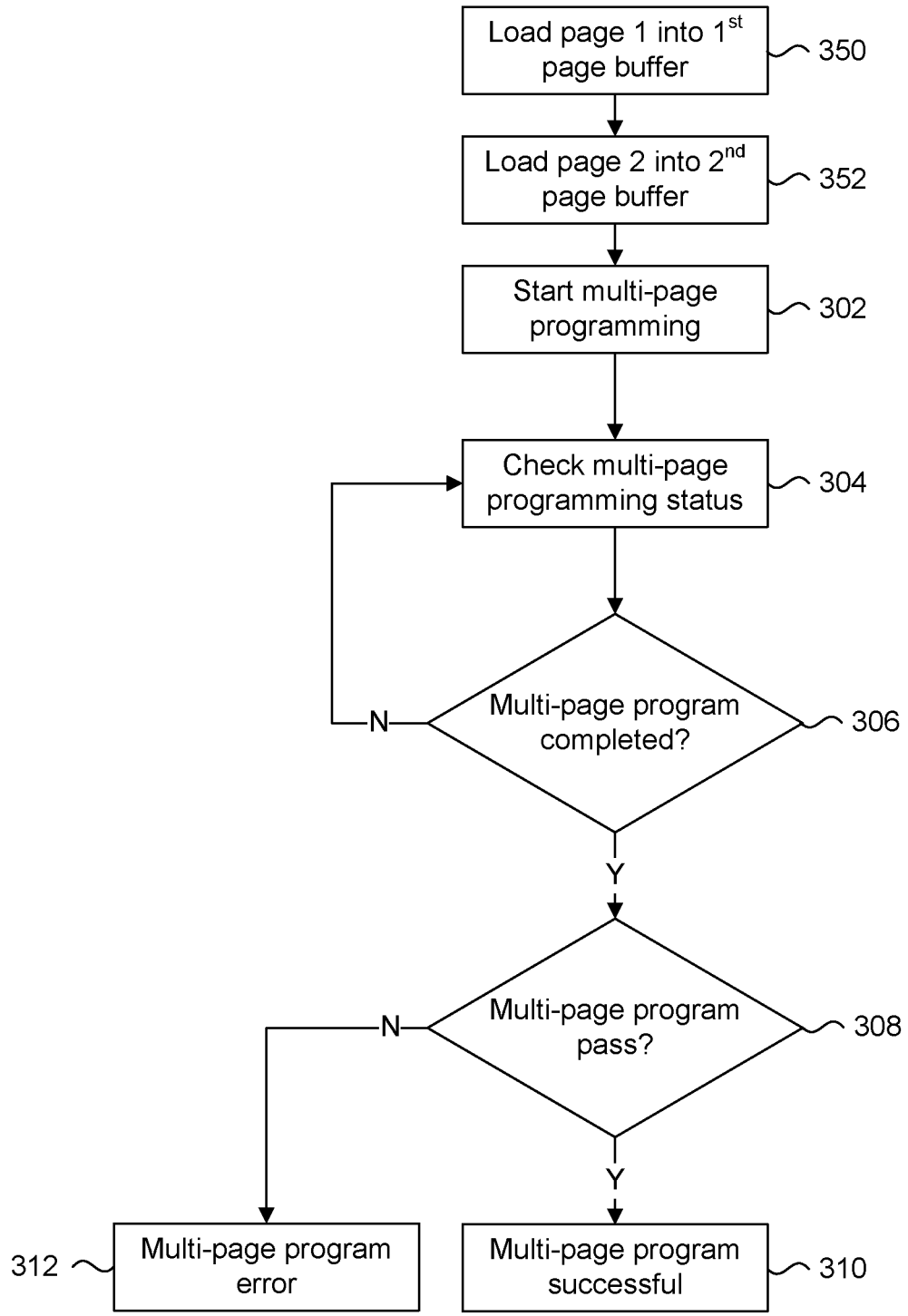
FIG. 10 is a flow chart of a method of operating a flash memory device for a two-page multi-page program operation, according to a present embodiment.
Figure 11:
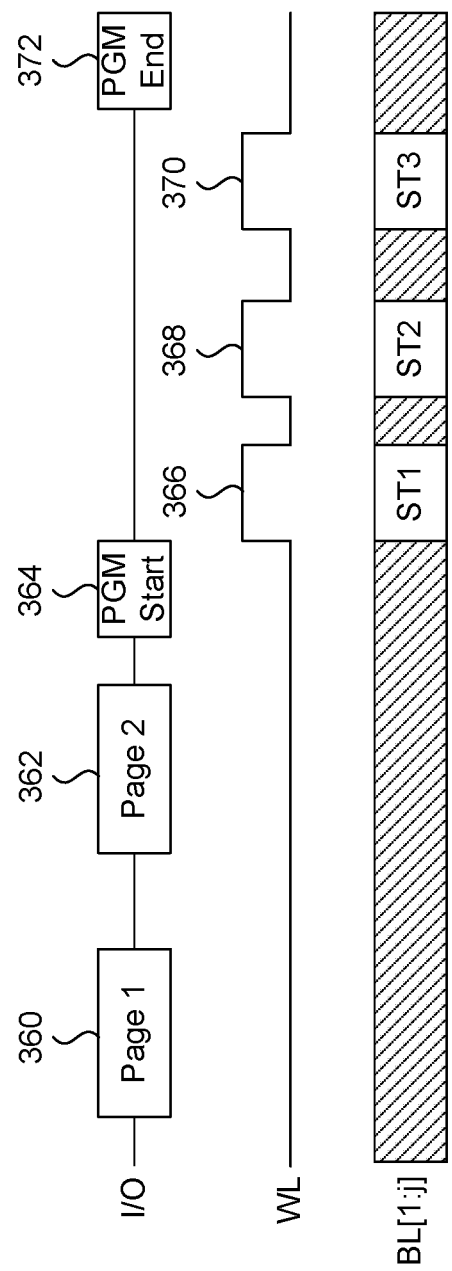
FIG. 11 is a sequence diagram showing an example two-page multi-page program operation of a flash memory device, according to a present embodiment.

The method of FIG. 9 is a general method for controlling a memory device to program m logical pages of data to a single physical page of the memory device. Many currently available flash memory devices can store 2 logical pages of data to a single physical page of the memory device. FIG. 10 shows a method of operating a flash memory device for a two-page program operation, according to a present embodiment. The method shown in FIG. 10 is now described with reference to FIG. 11, which shows a general sequence diagram of the operation of the memory device of the present embodiments. FIG. 11 shows signal traces for the memory device input output port I/O, a selected wordline of the memory device WL, and of bit lines BL[1:j]. The method of FIG. 10 starts at step 350 where a first page of data is provided to the memory device, and is stored in a first page buffer of memory device. As shown in FIG. 11, data Page 1 is received at the I/O port at 360. Shortly thereafter, a second page of data is provided to the memory device at step 352, which is stored in a second page buffer of memory device. As shown in FIG. 11, data Page 2 is received at the I/O port at 362. From this point on, steps 302 to 312 are the same as those shown and described for FIG. 9. Multipage programming is initiated at step 302, via a multipage program start command 364 of FIG. 11.

Once multipage programming is initiated within the memory device, the selected wordline WL is driven at 3 different time periods each with a predetermined programming profile. It should be noted that only 3 of the 4 possible states per cell are programmed since one of the states is the default erased state. In FIG. 11, the 3 time periods are shown by the wordline WL being driven to the high logic level at 366, 368 and 370. It should be noted that in the memory device, the wordline WL can be driven to different voltage levels for a specific amount of time during each time period. In one embodiment, program verify operations can be executed after each time period for validating the threshold voltage that was just programmed to the cells. FIG. 11 shows that the bit lines are biased during time periods 366, 368 and 370 for programming states 1, 2 and 3 respectively. In the present example embodiment, at the end of time period 366 certain memory cells will have a final threshold voltage corresponding to state 1 (ST1), at the end of time period 368 certain memory cells will have a final threshold voltage corresponding to state two (ST2), and at the end of time period 370 certain memory cells will have a final threshold voltage corresponding to state 3 (ST3). After time period 370 has lapsed, steps 304 to 312 are executed and the program cycle ends at 372 in FIG. 11 with the memory device reporting to the memory controller via its status registers if the multipage programming operation was successful or not.

Figure 12A:
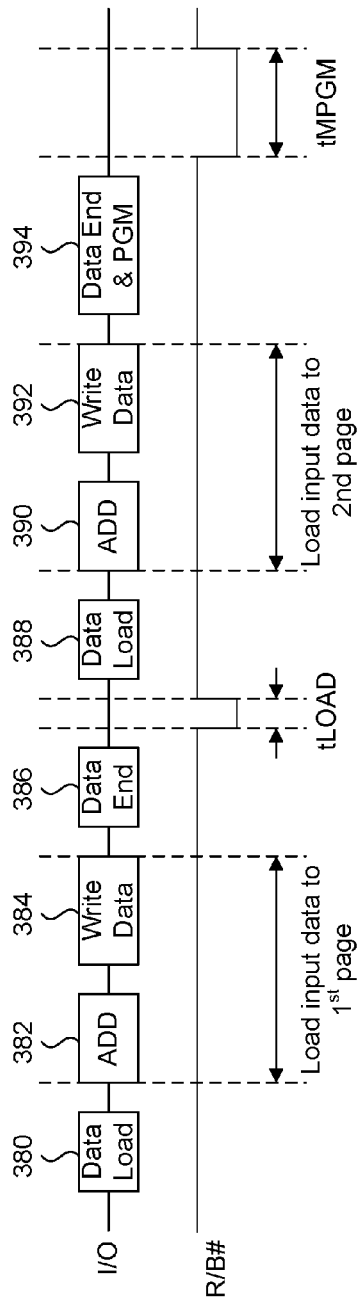
FIG. 12A is a sequence diagram showing an example command and data input sequence for a flash memory device, according to a present embodiment.

FIG. 12A is a sequence diagram showing an example command and data input sequence for a flash memory device according to the present embodiments. New FIG. 11A shows signal traces for the memory device input/output port I/O and a ready/busy signal R/B# provided by the memory device. The present example command and data input sequence is illustrated for a two-page multipage program operation. The commands shown in FIG. 12A can be provided in any format that is understood by the memory device to have the same function as presently described. Starting from the left side of FIG. 11, the first command to be received is a data load command 380, followed by input data, which includes address information 382 and write data 384. Address information 382 can include bank, row and column address information, and write data 384 is a page of data to be programmed to the memory device. A data end command 386 is received to indicate the end of the input data. Up to this point in time, the R/B# signal is at the high logic level to indicate that the memory device is in a ready state and is available to receive the information appearing on the I/O port. After the data end command 386 is received, the memory device may enter a busy state where R/B# falls to the low logic level for a very short period of time.

After R/B# rises to the high logic level, the memory controller can resume the multipage programming operation by issuing another data load command 388. Following is a second set of input data including address information 390 and write data 392. The address information can include the same column address as in address information 382, but would have a different row address to designate the write data as the second logical page. A final data end and multi-page program command 394 is received to indicate the end of the write data 392, and to initiate internal multipage programming operations of the memory device. Command 394 can be provided as a separate data end command, and a separate multipage program command. Thereafter, R/B# falls to the low logic level for a period of time required to program the to logical pages to a physical page of the memory device.

Figure 12B:
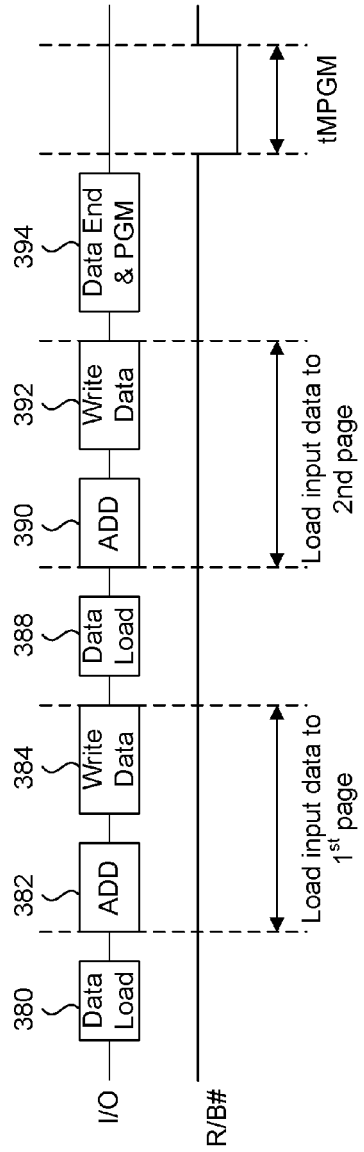
FIG. 12B is a sequence diagram showing an alternate example command and data input sequence for a flash memory device, according to a present embodiment.

FIG. 12B shows a variation of the command and data input sequence of FIG. 12A. In this embodiment, the memory device may not have the short busy period between command 386 and 388, and receipt of the data end command 386 is not required. Therefore the second data load command 388 can also serve as the data end command for write data 384. FIG. 12A and FIG. 12B are example command and data input sequences for controlling a memory device capable of multipage programming, however any command and data input sequence which results in loading of the page buffers of the memory device followed by internal multipage programming can be used.

As previously discussed, the memory cells connected to all bit lines are programmed to their respective logic states in one programming cycle, thereby avoiding the need to read out the page of data previously programmed in a previous programming cycle, before initiating a subsequent programming cycle for programming both pages of data to the same physical page. Following is a discussion of different techniques for programming all possible logic states to the memory cells of a memory device.

Figure 13:
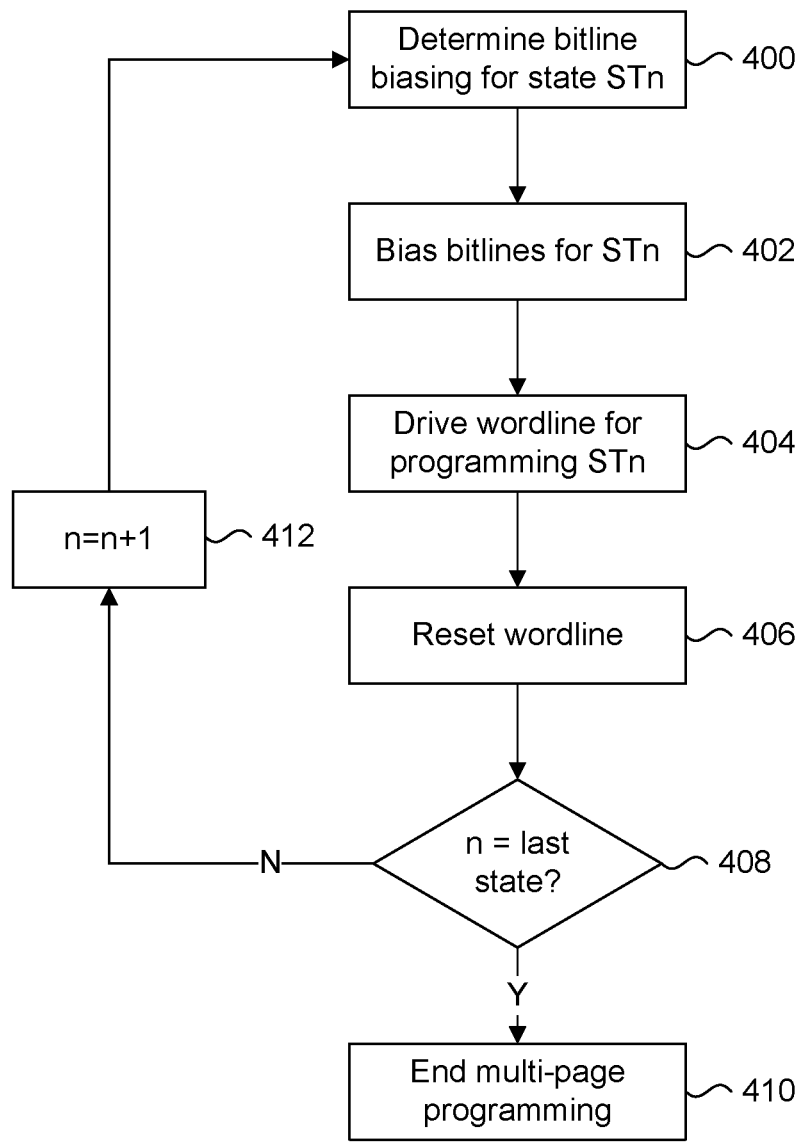
FIG. 13 is a flow chart of a method for programming all logic states to MLC flash cells in a single programming operation cycle, according to a present embodiment.
Figure 14A:
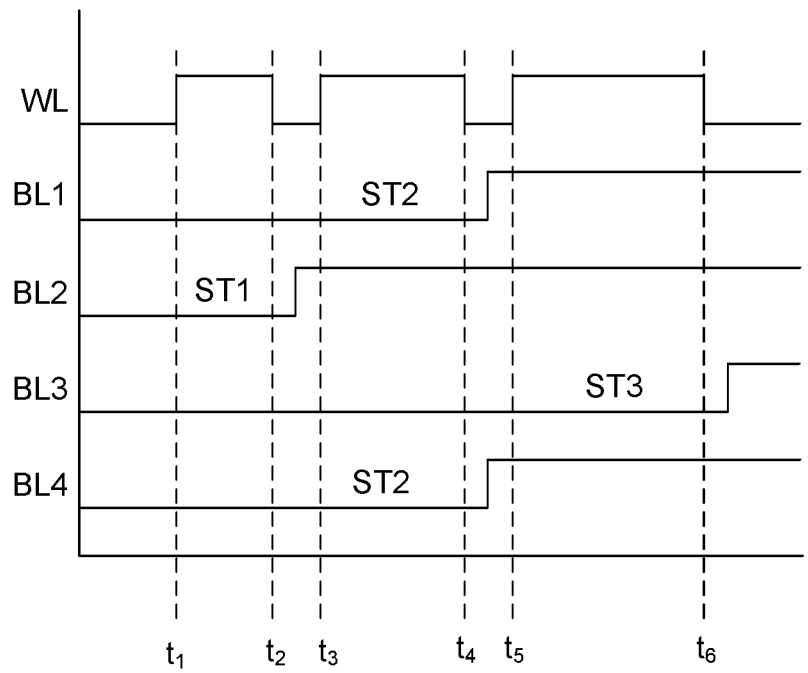
FIG. 14A is a sequence diagram showing a multi-page program operation for programming logic states to flash cells connected to 4 different bitlines, according to a present embodiment.
Figure 14B:
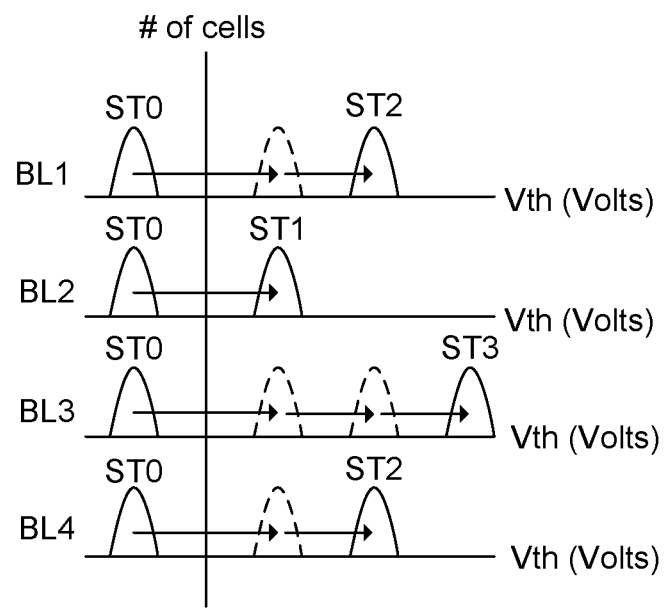
FIG. 14B is a threshold voltage distribution graph showing threshold voltages of the 4 flash cells programmed in FIG. 14A.

FIG. 13 is a flow chart outlining a method for programming multiple pages of data to one physical page of memory, according to a present embodiment. It is assumed that all the pages to be programmed in the multipage programming operation have been loaded into the page buffers of the memory device. Furthermore, it is assumed that all memory cells are currently in the erased state, and can have for example a negative threshold voltage. This erased state is referred to as ST0, as shown in FIG. 14B. The different states are to be programmed in an order of increasing corresponding threshold voltages. In the present example a first program state ST1 is programmed, followed by a second program state ST2, and then by a third program state ST3. The multi-page programming method of FIG. 13 is described with reference to an example 2 bit per cell programming scenario. Reference is made to FIG. 14A which is a timing diagram showing signal traces for a selected wordline WL and four bitlines BL1, BL2, BL3 and BL4, and to FIG. 14B that illustrates programming of threshold voltages for cells connected to the selected wordline and each of bitlines BL1, BL2, BL3 and BL4. In this scenario, the memory cells connected to BL1, BL2, BL3 and BL4 are to store threshold voltages corresponding to ST2, ST1, ST3 and ST2, respectively.

The method begins at step 400 where bitline biasing for the first state ST1 (where n=1) to be programmed is determined for all the bitlines. More specifically, the bitlines are biased either to a first voltage sufficient for enabling programming such as a low logic level (VSS), or to a second voltage sufficient for inhibiting programming of the memory cell such as a high logic level (VDD). At the time preceding $t_1$ in FIG. 14A, the selected wordline WL is maintained at an inactive level of VSS. Proceeding to step 402, the bitlines are biased for programming or inhibiting programming of the first program state (ST1) n=1. Because states ST2 and ST3 have final threshold voltages greater than the threshold voltage corresponding to state ST1, bitlines BL1, BL3 and BL4 are biased to VSS along with BL2. Following at step 404 the selected wordline is driven to program any flash memory cells connected to a bitline biased to the low logic level. In FIG. 14A, the selected wordline WL is driven to a representative high logic level at time $t_1$. This representative high logic level is used to show application of a programming profile effective for programming the threshold voltage corresponding to the n=1 program state. In actual use, the wordline could be driven to a high voltage level, or stepped in accordance with known wordline programming control schemes. Programming for state n=1 will end at a time determined by the specific programming profile for state n=1, at which time the selected wordline is reset at step 406.

In FIG. 14A, resetting WL to VSS occurs at time $t_2$. The time period bound by $t_1$ and $t_2$ is the first iteration of the program cycle. While not shown in FIG. 13, a program verify operation is executed to validate the threshold voltage of ST1 stored in the memory cell after time $t_2$. For the purposes of this example, it is assumed that all the memory cells are successfully programmed with the proper threshold voltages. Ideally, the flash memory cell connected to BL2 will have a final threshold voltage corresponding to ST1, as shown in FIG. 14B. However, the memory cells connected to BL1, BL3 and BL4 should now have intermediate threshold voltages corresponding to ST1, as shown by the dashed threshold voltage distribution curves in FIG. 14B, as these are not the final threshold voltages for the cells connected to these bitlines. Returning to FIG. 13, a determination is made at step 408 if the programmed state is the last state to be programmed. If so, then the method ends at step 410. Otherwise, there are more states to be programmed, and the method proceeds to step 412 where n is incremented (n=2) to indicate the next state to be programmed in a subsequent iteration. The method then returns to step 400 where the bitline biasing for step ST2 is determined. Because the memory cell connected to BL2 is intended to have a final state of ST1, the program verify circuits will inhibit BL2 from receiving the VSS voltage for enabling programming for all subsequent programming iterations in the present programming cycle.

Steps 402, 404 and 406 are repeated in a second iteration to program the second program state n=2, corresponding to ST2. In the example of FIG. 14A, this second iteration occurs between times $t_3$ and $t_4$ where BL1, BL3 and BL4 are biased for programming. As shown in FIG. 14B, the flash memory cells connected to BL1 and BL4 have final threshold voltages corresponding to ST2, while the memory cell connected to BL3 now has an intermediate threshold voltage corresponding to ST2. After the wordline is reset in step 406, BL1 and BL4 are inhibited from receiving any further VSS voltage in any subsequent programming iteration since the memory cells connected to these two bitlines are intended to have a final state of ST2.

Since the program state corresponding to ST3 is yet to be programmed, a third iteration of steps 400, 402, 404 and 406 are repeated in a third iteration to program the third program state n=3, corresponding to ST3. In the example of FIG. 14A, this third iteration occurs between times $t_5$ and $t_6$ where BL3 is biased to VSS for programming As shown in FIG. 14B, the flash memory cell connected to BL3 has a final threshold voltage corresponding to ST3. Since program state n=3 is the last state to be programmed, the programming cycle will end at step 410.

Therefore in the above described multipage programming method, any memory cell having a final threshold voltage greater than the current threshold voltage being programmed will have its threshold voltage increased at the same time. Therefore, based on the manufacturing process, device geometries and desired threshold voltages for each state, each wordline programming profile for a particular program iteration is engineered to have a cumulative effect for changing the threshold voltage of a memory cell to a desired threshold voltage. In the embodiment of FIG. 14A by example, the program iteration between time t3 and time t4 for BL1 shifts the threshold voltage of the memory cell from intermediate state ST1 to the threshold voltage corresponding to the final state ST2.

Figure 15A:
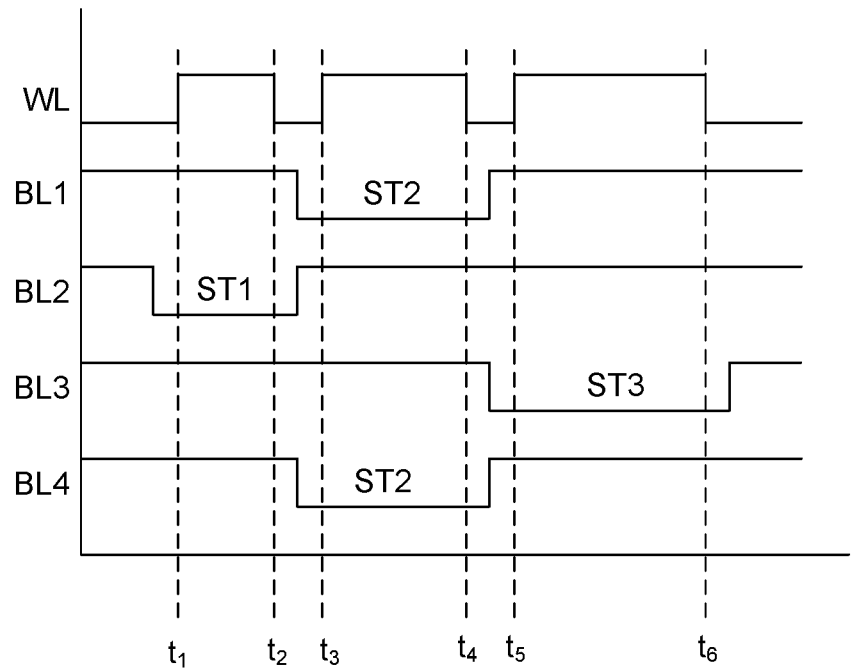
FIG. 15A is a sequence diagram showing an alternate multi-page program operation for programming logic states to flash cells connected to 4 different bitlines, according to a present embodiment; and, FIG. 15B is a threshold voltage distribution graph showing threshold voltages of the 4 flash cells programmed in FIG. 15A.
Figure 15B:
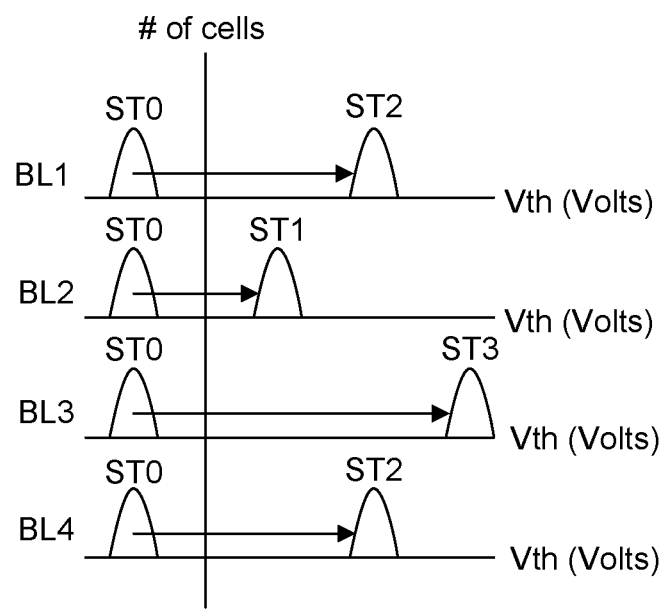

According to an alternate embodiment, each wordline programming profile can be engineered to shift or change an erase threshold voltage directly to a threshold voltage corresponding to a final state. This embodiment is illustrated in FIG. 15A and FIG. 15B. It is assumed that the same states are being programmed to the memory cells connected to BL1, BL2, BL3 and BL4 as in the example shown in FIG. 14A and FIG. 14B. In the present embodiment of FIG. 15A and FIG. 15B, the bitline is only biased to a voltage level for enabling programming for the duration of one program iteration where the wordline is driven with a specific programming profile. As shown in FIG. 15A, BL1 is driven to the low logic level of VSS just before the wordline is driven at time t3, and is then driven back to the high logic level of VDD just after the wordline is de-asserted at time t4. As shown in FIG. 15B, erase threshold voltage of the memory cell connected to bitline BL1 is shifted directly to a threshold voltage corresponding to state ST2. Similar biasing sequences for bitline BL2, BL3 and BL4 are shown in FIG. 15A for programming states ST1, ST2 and ST3 respectively. Accordingly, there are three specific wordline programming profiles each effective for shifting the erase threshold voltage to each of the threshold voltages corresponding to ST1, ST2 and ST3, and the bitlines are biased to enable programming for that specific state while being biased for inhibiting programming for all other states.

Timing and voltage level control of the selected wordline for the various programming profiles for the multipage programming embodiments of FIG. 14A and FIG. 15A is provided by control circuit 108 of FIG. 8, via high voltage generator 106 and row circuits 104. In both embodiments, the timing for biasing the bitlines is controlled by control circuit 108 and in response to the pages of data stored in the page buffers.

Figure 4:
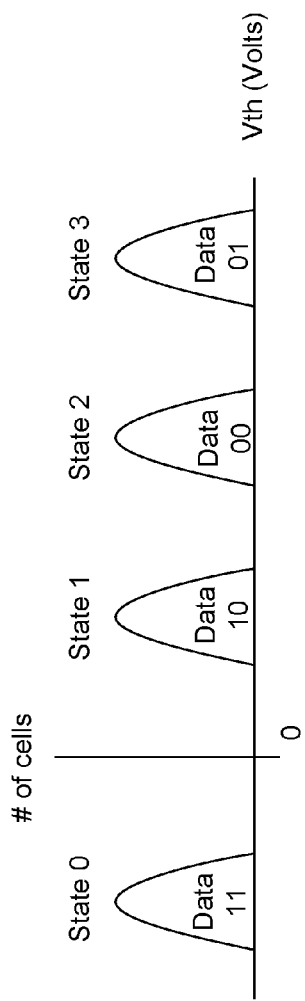
FIG. 4 is a threshold voltage distribution graph for a two-bit flash memory cell.

The biasing of each of the bit lines for programming data or inhibiting programming of data in the multipage programming schemes shown in FIG. 14A and FIG. 15A, can be done in response to the logic states of the bits stored in the page buffers 112 and 114 of FIG. 8. For example, a specific logic state of a pair of bits stored in page buffers 112 and 114 corresponding to a bitline indicates that the bitline is to be biased to a voltage level effective for enabling programming of a selected memory cell. With reference to FIG. 4 by example, State 1, State 2 and State 3 each have a pair of bits where at least one of the bits is a logic 0. Therefore in this example, the presence of at least one logic 0 bit of a pair of bits corresponding to one bitline can be detected for biasing the bitline to a voltage level effective for enabling programming. Otherwise, if both pairs of bits are logic 1, then the bitline is biased to a voltage level effective for inhibiting programming of a selected memory cell connected to that bitline. It is noted that State 0 of FIG. 4 has both bits at a logic one. Since State 0 is the default erased state, any bitline having binary values "11" associated with it is biased for inhibiting programming.

Therefore, the example binary values assigned to State 0, State 1, State 2 and State 3 of FIG. 4 can be advantageously used for controlling the bitlines in the multipage programming scheme shown in FIG. 14A. More specifically, certain bit lines are biased to a high logic level after each programming iteration for inhibiting further programming in subsequent programming iterations, if the final desired program state for that bitline has been verified after a specific programming iteration. On the other hand, if this specific programming iteration results in successful programming of an intermediate state, then the bitline should remain biased for further programming in a subsequent programming iteration. This can be achieved by toggling the logic states of the pairs of bits corresponding to each bitline to different values.

In one example, the logic states of a pair of bits can be toggled to the binary value of "11" which indicates that the final state has been programmed, or to a binary value including at least one logic 0 which indicates that an intermediate state has been programmed. Data state transition rules can implemented to ensure that the data transitions from an original data state to one or more intermediate states, and finally to a final state.

Using the example binary value assignments shown in FIG. 4, and the presence of at least one logic 0 bit in a pair of bits to enable programming, the following example data transition rules can be developed:

(1) "10" to "11"
(2) "00" to "10"
(3) "01" to "00"

Table 1 below illustrates an example application of these data transition rules for bitlines, BL1, BL2 and BL3 shown in FIG. 14A. In Table 1, 3 program iterations are shown as "PGM 1", "PGM 2" and "PGM 3". Each program iteration starts with the initial binary values "Initial" stored in the data buffers corresponding to the respective bitline, which are toggled to new binary values "New" after successful program verification.

TABLE 1

|     | PGM 1 | | PGM 2 | | PGM 3 | |
| --- | --- | --- | --- | --- | --- | --- |
|     | Initial | New | Initial | New | Initial | New |
| BL1 | "00" | "10" | "10" | "11" | — | — |
| BL2 | "10" | "11" | — | — | — | — |
| BL3 | "01" | "00" | "00" | "10" | "10" | "11" |

Figure 16:
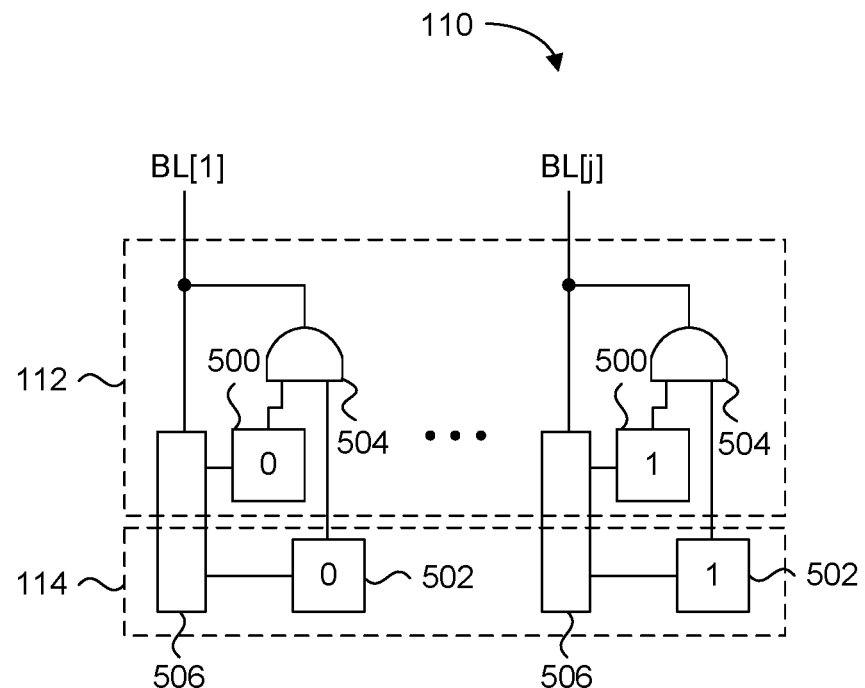
FIG. 16 is a block diagram of the bitline access circuitry shown in FIG. 8, according to a present embodiment.

FIG. 16 is a functional block diagram of the bitline access circuitry 110 shown in FIG. 8, according to a present embodiment. FIG. 16 is intended to illustrate the general principle for biasing bitlines for enabling or inhibiting programming of the selected memory cell in response to the data stored in the page buffers associated with or corresponding to a particular bitline, and it is assumed that other circuits, such as bitline sense amplifiers and program verify circuits are present to enable proper operation. Such other circuits are not shown in order to simplify the schematic. Only the circuits associated with a first bitline BL[1] and the last bitline BL[j] are shown in FIG. 16. The bitlines are biased by the bitline access circuitry 110 in coordination with the wordlines being driven at the different time intervals. Page buffer 112 includes a plurality of data storage circuits 500, each for storing 1 bit of a first page of data. Page buffer 114 includes a plurality of data storage circuits 502 each for storing 1 bit of a second page of data. Each pairing of data storage circuits 500 and 502 connected to AND logic gate 504 are associated with a respective bitline.

In addition to storing bits of the first page of data and the second page of data, bitline access circuitry 110 includes data decoding circuitry for biasing each bitline to either a program inhibit voltage or a program enable voltage in response to the specific logic states of the bits from both pages of data corresponding to the bitline. The data decoding circuitry for each bitline includes an AND logic gate 504 and a data verify decoder 506. Prior initiation of a program iteration, the AND logic gate 504 receives the logic states stored in data storage circuits 500 and 502, and biases the bitline in response to the logical AND operation. In the presently described examples, a bitline is biased to VSS when at least one of the data storage circuits 500 and 502 stores a logic 0.

The data verify decoder 506 includes logic circuitry for decoding the logic states stored in data storage circuits 500 and 502, and for selectively inverting either stored logic state such that data storage circuits 500 502 store new binary values in response to a detected condition of the bitline indicative of successful programming. This can be considered program verify circuitry. This selective inversion of either stored logic state in data storage circuits 500 and 502 is done in accordance with the predetermined data transition rules. In the present embodiment, inversion of the data storage circuits 500 and 502 is executed in response to successful program verification of a completed program iteration. If the memory cell has not been sufficiently programmed to have the desired threshold voltage, then programming is repeated. In the present example, a successfully programmed memory cell for any program state forms a current path to VSS, thereby discharging a bitline precharged to VDD to VSS during the program verify operation. Otherwise, the bitline remains substantially at the pre-charged VDD level to indicate that a repeated programming iteration is required for the memory cell connected to that bitline. Therefore in the present embodiments, selective data inversion in accordance with the data transition rules is executed when the bitline is at VSS a program verify operation. Otherwise, no selective data inversion is executed.

Figure 17:
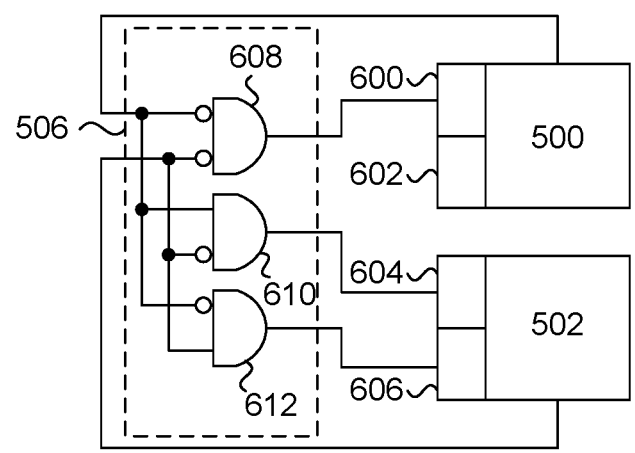
FIG. 17 is a schematic showing details of the data decoder of FIG. 16, according to a present embodiment.

FIG. 17 shows further details of the data verify decoder 506 and its interconnections to data storage circuits 500 and 502, according to present embodiment. Data storage circuit 500 includes a logic 0 inversion circuit 600 and a logic 1 inversion circuit 602. Data storage circuit 502 includes a logic 0 inversion circuit 604 and a logic 1 inversion circuit 606, both of which are the same as circuits 600 and 602 respectively. The logic 0 inversion circuit 600 will invert any logic 0 state stored in data storage circuit 500 to a logic 1 state, in response to a decoded data signal received from data verify decoder 506. The logic 1 inversion circuit 602 will invert any logic 1 state stored in data storage circuit 500 to a logic 0 state, in response to a decoded data signal received from data verify decoder 506. Inversion circuits 604 and 606 perform the same function as described above for inversion circuits 600 and 602. As shown in FIG. 17, inversion circuits 600, 602, 604 and 606 receive different decoded data signals.

The data verify decoder 506 includes AND logic gates 604, 606 and 608. Each AND logic gate has a first input which receives the stored logic state from data storage circuit 500, and a second input which receives the stored logic state from data storage circuit 502. It should be noted that each AND logic gate has a different combination of inverted and non-inverted first and second inputs, and the output of each AND logic gate is provided to specific inversion circuits (600, 602, 604 and 606). This configuration of the different combinations of inverted and non-inverted first and second inputs is a specific example of an implementation of the previously described data transition rules. While not shown, each bitline includes detection circuitry for detecting the low voltage level of the bitline during program verification, and enabling the data verify decoder 506. Otherwise, if a high voltage level of the bitline is detected, then programming was not successful and the data verify decoder 506 is disabled to prevent inversion circuits 600, 602, 604 and 606 from operating.

An example operation of the circuits of FIG. 17 now follows using the previously described example scenario of BL3 of Table 1 where the initial binary value of "01" is stored in data storage circuits 500 and 502. Accordingly, it should be understood that data storage circuit 500 stores in logic 0 while data storage circuit 502 stores a logic 1. Following the first program iteration PGM 1 and assuming that program verification is successful, the initial binary value of "01" causes AND gate 612 to output a logic 1 to logic 1 inversion circuit 606. In response, logic 1 inversion circuit 606 toggles the data storage circuit 502 and the initially stored logic 1 is changed to a logic 0. Logic 0 inversion circuit 600 received a logic 0 from AND gate 608 and therefore does not toggle data storage circuit 500. Accordingly, the new binary value is "00" store in data storage circuits 500 and 502, and the corresponding bitline remains biased to enable programming for the subsequent program iteration PGM 2. After successful program verification of PGM 2, the data verify decoder 506 can decode the "00" binary values from data storage circuits 500 and 502. Now, AND logic gate 608 outputs a logic 1 to logic 0 inversion circuit 600, which toggles the data storage circuit to change the stored logic 0 to a logic 1. The outputs of AND logic gates 610 and 612 are at the inactive logic 0 state, therefore no changes are made to data storage circuit 502.

Now the new binary value of "10" is stored in data storage circuits 500 and 502, and the corresponding bitline remains biased to enable programming for the subsequent program iteration PGM 3. After successful program verification of PGM 3, the data verify decoder 506 can decode the "10" binary values from data storage circuits 500 and 502. AND logic gate 604 outputs a logic 1 to logic 0 inversion circuit 604, which toggles the data storage circuit 502 to change the stored logic 0 to a logic 1. Now both data storage circuits 500 and 502 store a logic 1, and the bitline is biased to VDD for inhibiting programming. The presently shown example data verify decoder 506 and its connections to the inversion circuits ensures that for any initial programmable state of FIG. 4 stored in the data storage circuits 500 and 502 will be transitioned to the next intermediate or final state according to the data transition rules.

The presently described data transition rules and example circuit embodiments shown in FIGS. 16 and 17, are presented to illustrate the principle behind biasing the bitlines based on a specific binary value assignment for possible storage states, such as for the binary value assignments shown in FIG. 4. An assignment of different binary values for these 4 states can be used, and a different set of data transition rules can be developed. Accordingly, the configuration of data verify decoder 506 and its connection to the inversion circuits can be adapted to accommodate such an alternate binary value assignment and data transition rules. The presently described embodiments are directed to a 2 bits per cell configuration, but can be easily scaled for 3 bit per cell or more configurations based on the presently described principles. Other circuit techniques can be used for achieving the same desired result. Furthermore, the present examples described how a logic "0" is used to indicate further biasing of a bitline for enabling programming, but alternate embodiments can use a logic "1" instead.

Therefore, the multipage programming circuits and methods described in the previous embodiments reduces the total program time relative to prior techniques where multiple program cycles are required for programming each logical page of data to a physical page. This is due to the fact that timing overhead typically required for programming different logical pages in different programming cycles is eliminated in the present multipage programming embodiments because all the logical pages are programmed within one programming cycle. Furthermore, there is a reduction in programming stress of the flash memory cells when compared to using separate programming cycles for programming each logical page. Additionally, this power is required for programming when using the presently described multipage programming embodiments relative to the prior art programming techniques.

Figure 18A:
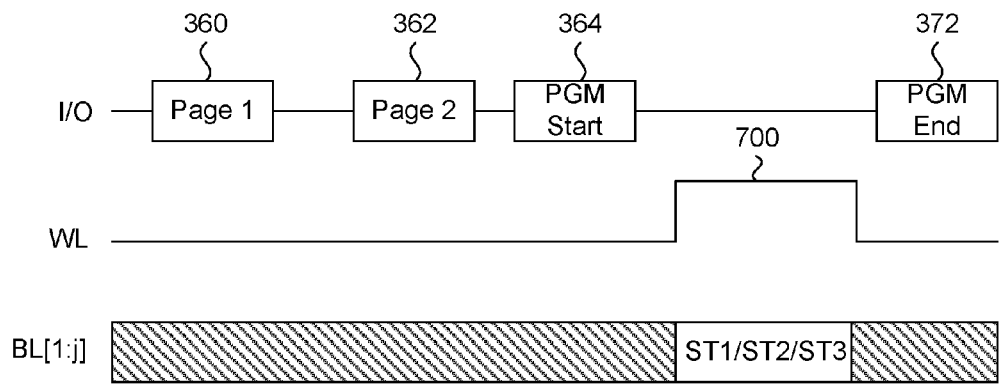
FIG. 18A is a sequence diagram showing a two-page parallel multi-page program operation of a flash memory device, according to a present embodiment.

The previously described embodiments can be further improved for reducing the overall time required for programming all states in one programming cycle. In the previously described embodiment of FIG. 11 by example, multiple programming iterations are sequentially executed for programming each state to the selected cells for that particular iteration. More specifically, one programming cycle for programming multiple states or pages to memory cells involves sequential application of different bitline voltages and driving the selected wordline with a particular programming profile for a specific state/threshold voltage to be programmed. Therefore the total time for the programming cycle is the sum of the time required for each programming iteration. According to a present alternate embodiment, the programming cycle time can be significantly reduced by programming all possible states to the cells in a single programming iteration. In other words, instead of sequential programming iterations for programming each state, all the states are programmed in parallel when the selected wordline is driven with a programming profile. This is referred to as parallel multi-state programming FIG. 18A is a sequence diagram showing an example two-page parallel multi-state program operation of a flash memory device, according to a present embodiment. This sequence diagram is similar to the one shown in FIG. 11, in that data Page 1 is received at the I/O port at 360 and data Page 2 is received at the I/O port at 362. Multipage programming is initiated via a multipage program start command 364, as in FIG. 11, as is the indication to the memory controller that the program cycle has ended at 372 with the memory device reporting to the memory controller via its status registers if the multipage programming operation was successful or not. However, instead of the 3 time periods 366, 368 and 370 required for programming all the states, only one single time period 700 is required. During this time period 700 where the selected wordline is driven with a predetermined programming profile, the bitlines BL[1:j] are biased to specific voltage levels for programming threshold voltages corresponding to different states, where the voltage levels are calibrated for a particular manufacturing process. It is noted that the programming profile of the wordline is optimized for effective programming of the threshold voltages for the particular manufacturing process.

Figure 18B:
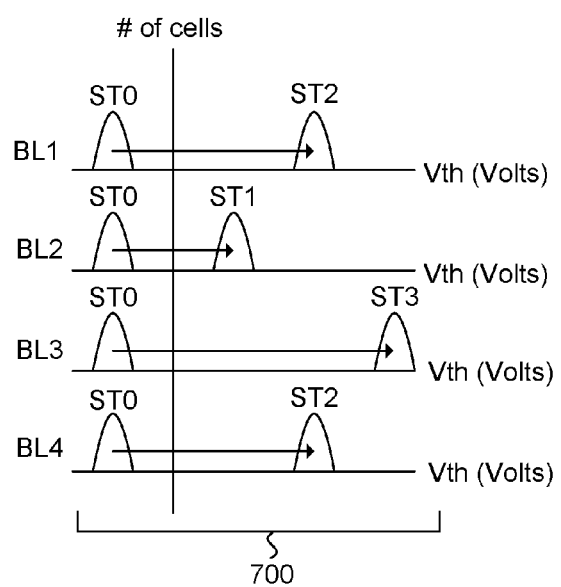
FIG. 18B is a threshold voltage distribution graph showing example threshold voltages of flash cells programmed in FIG. 18A.

As shown in FIG. 18A, states ST1, ST2 and ST3 are programmed at the same time to the memory cells in response to specific bitline voltage levels while the wordline is driven during time period 700. FIG. 18B is a threshold voltage distribution graph showing threshold voltages of 4 flash cells programmed in FIG. 18A connected to bit lines BL1, BL2, BL3 and BL4. As shown in FIG. 18B, the memory cells are shifted from ST0 to their respective final programmed threshold voltages corresponding to ST1, ST2 and ST3 during time period 700.

Figure 19A:
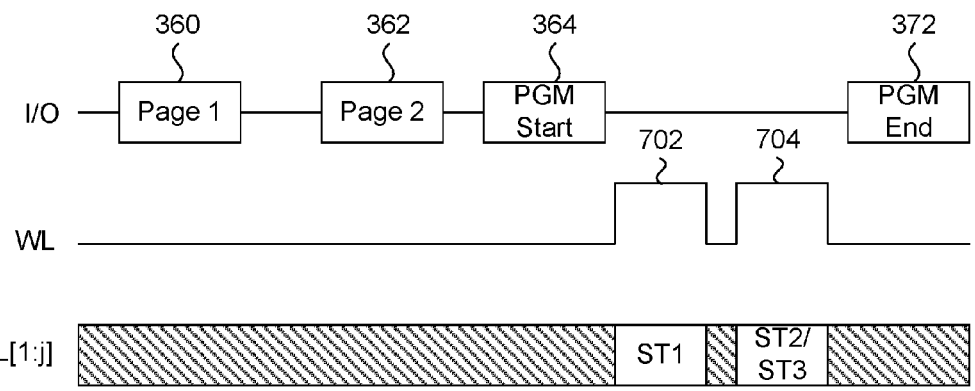
FIG. 19A is a sequence diagram showing an alternate two-page parallel multi-page program operation of a flash memory device, according to a present embodiment.
Figure 20A:
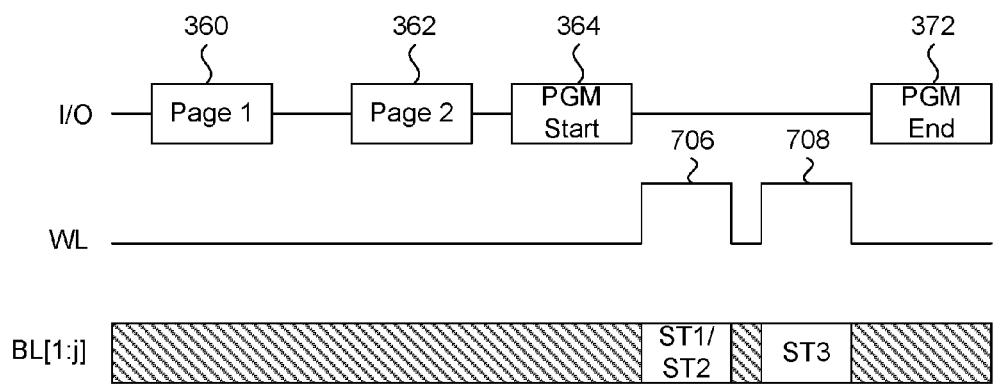
FIG. 20A is a sequence diagram showing an alternate two-page parallel multi-page program operation of a flash memory device, according to a present embodiment.

FIG. 19A and FIG. 20A are alternate sequence diagrams showing example two-page mixed sequential and parallel multi-page program operations of a flash memory device. In these alternate embodiments, multiple program iterations are used, where a subset of the possible states to be programmed are programmed in parallel in one iteration while a remaining state or states are programmed in a second iteration.

Figure 19B:
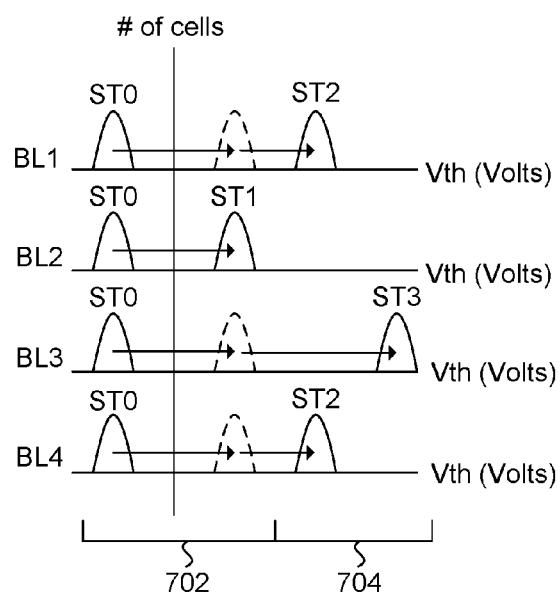
FIG. 19B is a threshold voltage distribution graph showing example threshold voltages of flash cells programmed in FIG. 19A.

In FIG. 19A, reference numbers 360, 362, 364 and 372 are the same as previously described for FIG. 18A and FIG. 11. In this alternate embodiment, one state ST1 is programmed at time period 702, followed sequentially with parallel multi-state programming of states ST2 and ST3 at time period 704. It is noted that after the first programming iteration occurring at time period 702, the memory cells designated for storing states ST2 and ST3 will have the same threshold voltage corresponding to state ST1. In the following time period 704, the cells having the threshold voltage corresponding to ST1 are further adjusted to correspond to states ST2 and ST3. As shown in the threshold voltage distribution graph of FIG. 19B, the memory cells starting with the erased threshold voltage corresponding to the state of ST0 are shifted to the programmed threshold voltage corresponding to ST1 in time period 702. In time period 704, the memory cells connected to bit lines BL1, BL3 and BL4 have their intermediate threshold voltages corresponding to ST1 shifted to the final threshold voltages corresponding to ST2 and ST3.

Figure 20B:
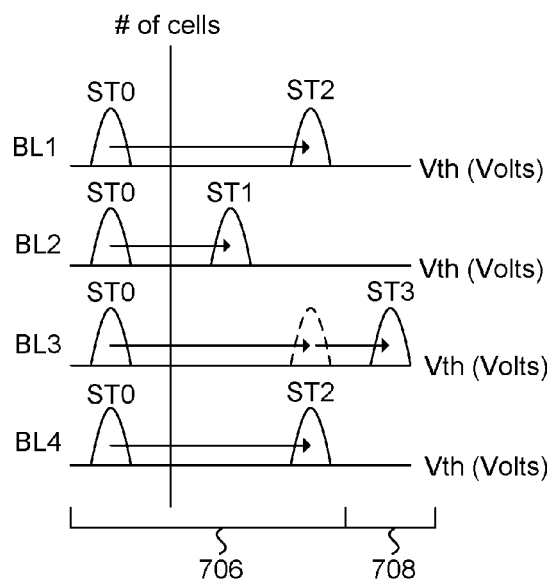
FIG. 20B is a threshold voltage distribution graph showing example threshold voltages of flash cells programmed in FIG. 20A.

In the embodiment of FIG. 20A, parallel multi-state programming of states ST1 and ST2 occurs at time period 706, followed sequentially with programming of remaining state ST3 at time period 708. It is noted that after the first programming iteration occurring at time period 706, the memory cells designated for storing state ST3 will have the same threshold voltage corresponding to the state having the higher threshold voltage, which in this example is state ST2. In the following time period 708, the cells having the threshold voltage corresponding to ST2 are further adjusted to correspond to state ST3. As shown in the threshold voltage distribution graph of FIG. 20B, the memory cell connected to BL2 has its erased threshold voltage shifted to the threshold voltage corresponding to ST1 in time period 706. Also occurring in time period 706, the memory cells connected to BL1, BL3 and BL4 have their erased threshold voltages shifted to the threshold voltage corresponding to ST2, including the memory cell connected to BL3. In time period 708, the memory cell connected to bit line BL3 has its intermediate threshold voltage corresponding to ST2 shifted to the final threshold voltage corresponding to ST3.

In both the alternate embodiments shown in FIGS. 19A, 19B, 20A and 20B, at least two states are programmed in parallel. It should be noted that these embodiments are non-limiting, as alternate embodiments can include having a first program iteration to program at least 2 states in parallel, followed by a second program iteration to program at least another 2 states in parallel. Furthermore, combinations of parallel multi-state programming iterations and single state programming iterations can be used.

For the embodiments shown in FIG. 18A, FIG. 19A and FIG. 20A, the command and data input sequences shown in FIG. 12A and FIG. 12B can be used for loading the memory device with pages of data, and to initiate a multi-state parallel programming operation or one of the two mixed sequential and parallel multi-state program operations.

The presently disclosed embodiments of parallel multi-state programming are achieved by biasing the bitlines to specific voltages, referred to as bitline voltage modulation. As previously discussed, a memory cell connected to a bitline is either inhibited from being programmed or enabled for programming via the selected wordline, depending on the logic level the bitline is biased, or set to. Commonly owned U.S. Pat. No. 7,511,996, incorporated herein by reference, describes embodiments for inhibiting programming of a memory cell, in which memory cells selected for programming have their bit lines biased to a program voltage such as 0V for example, and memory cells not to be programmed have their bitlines biased to a program inhibit voltage such as VCC for example. A description of one such embodiment described in U.S. Pat. No. 7,511,996 is first provided in order to facilitate an understanding of how a program inhibit voltage applied to a bitline can inhibit programming of a selected memory cell.

Figure 21:
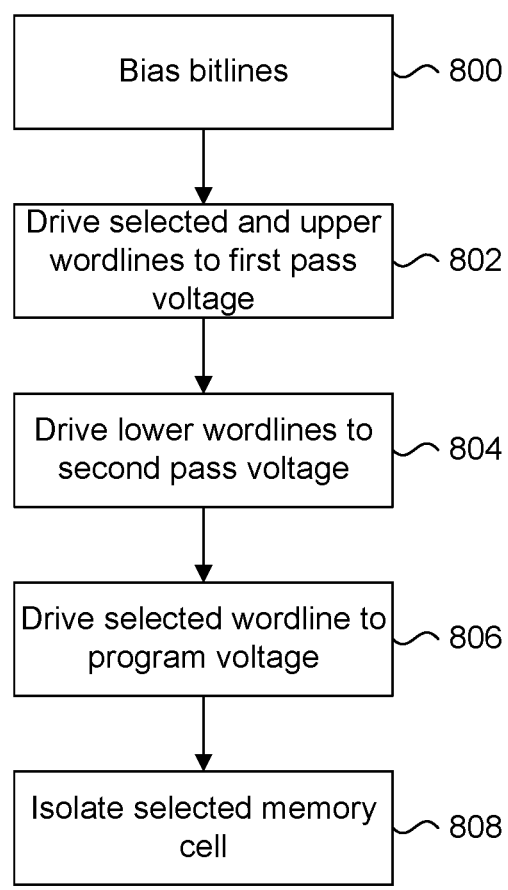
FIG. 21 is a flow chart illustrating a program inhibit method for flash memory cells.

FIG. 21 is a flow chart illustrating an embodiment of a program inhibit method of U.S. Pat. No. 7,511,996. In the present discussion, upper wordlines refer to those wordlines and memory cells between the selected memory cell and the bitline, while lower wordlines refer to those wordlines and memory cells between the selected memory cell and the sourceline. The program inhibit method of FIG. 21 begins at step 800, where the bitlines are biased with an inhibit voltage or a program voltage. In the presently described example, it is presumed that the bitline is driven to an inhibit voltage of VCC. At step 802, the selected wordline and the upper wordlines are driven to a first pass voltage. This first pass voltage is high enough to turn on each memory cell corresponding to an upper wordline, regardless of its programmed or unprogrammed state. Concurrently with step 802, the lower wordlines are driven to a second pass voltage at step 804. According to embodiments of the present method, the first pass voltage and the second pass voltage can be identical to each other, or the second pass voltage can be lower than the first pass voltage. The selected wordline is then driven to a programming voltage at step 806, followed by an isolation operation at step 808 for decoupling the selected memory cell from the unselected memory cells of the NAND string.

Figure 22A:
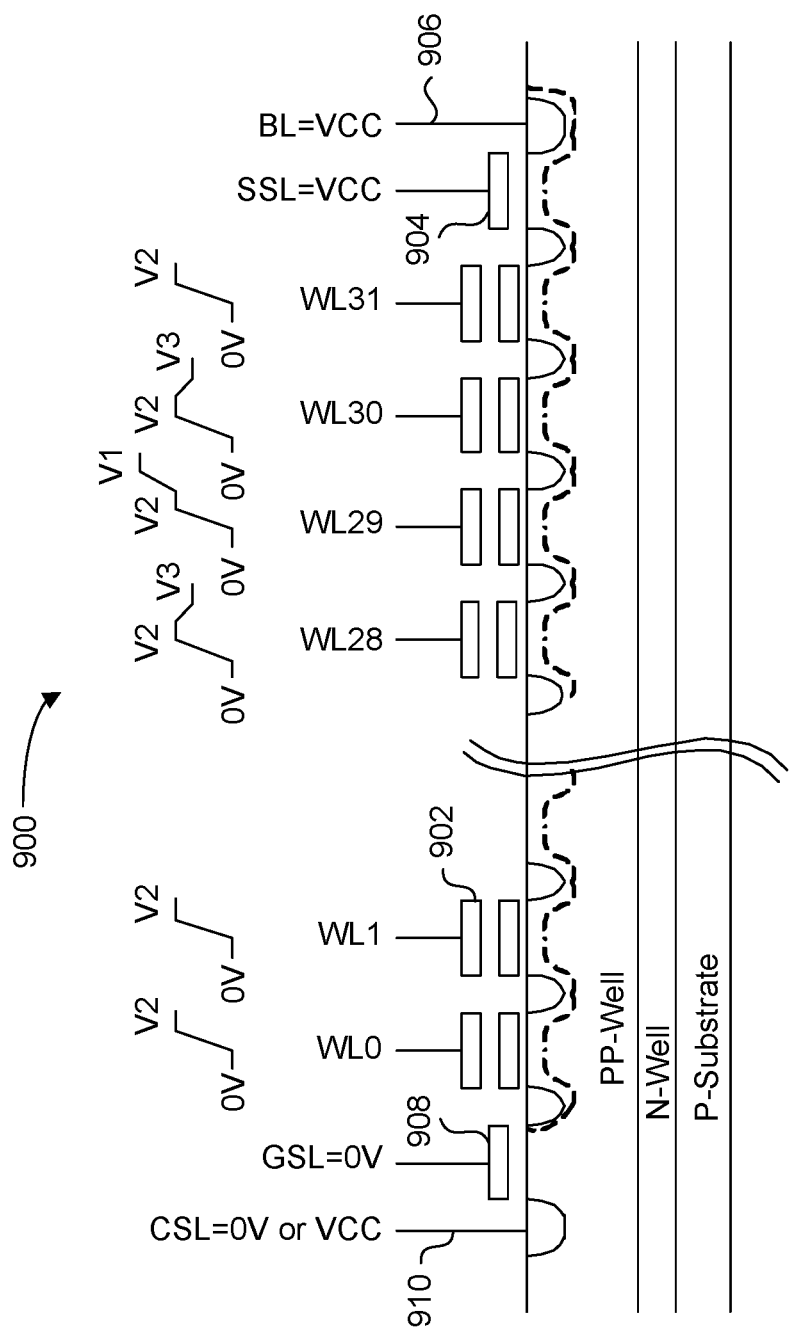
FIG. 22A is cross sectional view of a NAND cell string.

FIG. 22A is a simplified cross sectional view of a NAND string 900, which should be well known to persons skilled in the art. NAND string 900 includes memory cells 902 having gates connected to wordlines WL0 to WL31, a string select transistor 904 for coupling the NAND string 900 to a bitline 906, and a ground select transistor 908 for coupling the NAND string 900 to a source line 910. The NAND string 900 is formed within a PP-Well, which is itself formed within an N-Well of the P-substrate. The source/drain regions of the NAND string memory cell transistors are n+ diffusion regions.

Figure 22B:
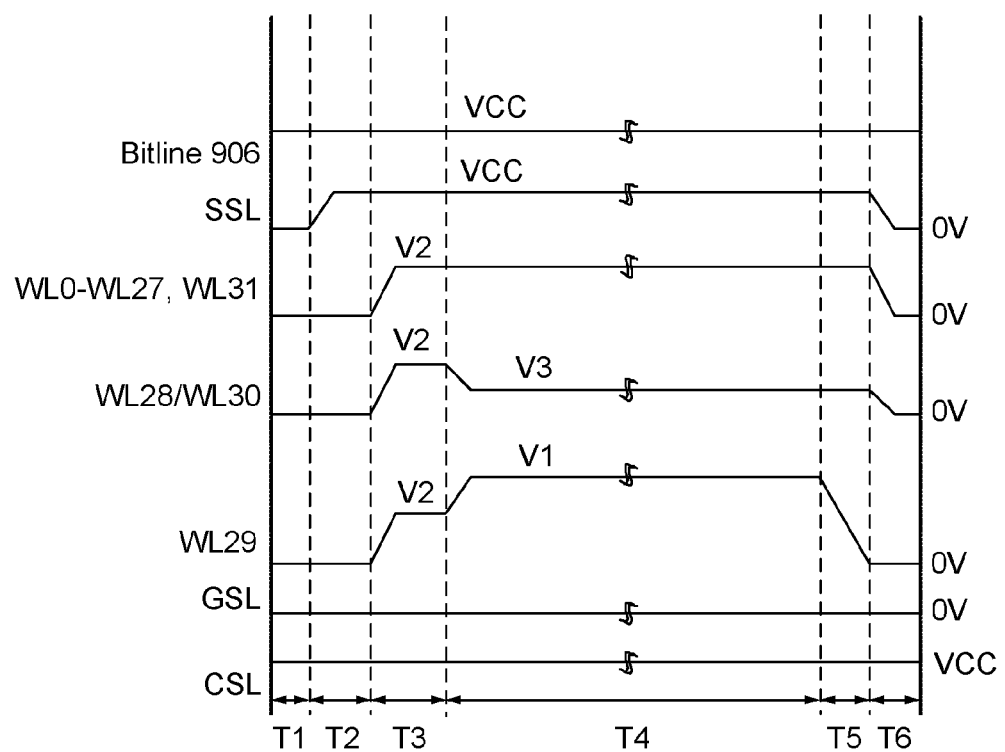
FIG. 22B is a sequence diagram illustrating an example of the program inhibit method of FIG. 21.

FIG. 22A includes annotations to show relative voltage levels applied to specific wordlines, according to an embodiment of the present invention. It is noted that the physical NAND string remains unchanged from the prior art. In the example shown in FIG. 22A, it is assumed that the memory cell connected to WL29 is selected for programming, and the data to be programmed is the logic "1" state. Since the erased state is a logic "1", programming is to be inhibited. FIG. 22B is a sequence diagram further illustrating the sequence of the voltages being applied in FIG. 22A.

Time period T1 is an initial state, where the gates of all the memory cells 902, signal SSL, and signal GSL are biased to 0V, while the bitline voltages for programming memory cells and for inhibiting programming of memory cells are applied. CSL can be biased to either 0V or VCC, but can be preferably biased to VCC in the present example to minimize leakage. In the present example, bitline 906 is biased to VCC to inhibit programming. At time period T2, signal SSL is biased to VCC for coupling the bitline voltage to NAND string 900. In NAND string 900 shown in FIG. 22A, string select transistor 904 electrically turns off because its drain terminal connected to the bitline 906 and its gate are both biased to VCC. More specifically, string select transistor 904 will turn off once its source rises to about VCC minus a threshold voltage of the transistor. During time period T3, all the wordlines (upper, lower and selected wordlines) are driven to a pass voltage V2, where V2 is selected to be higher than VCC. This has the effect of boosting the entire channel of NAND string 900 to the primary boosted voltage. At the beginning of time period T4, the selected wordline WL29 is raised to the programming voltage V1 while the adjacent wordlines WL28 and WL30 are reduced to a decoupling voltage V3. These correspond to steps 104 and 106 respectively in FIG. 5. The voltage level of V1 is set to be higher than V2, and the voltage level of V3 is set to be lower than V1 and V2.

A further advantage of reducing the wordline voltage of WL28 and WL30 to V3 is to compensate for capacitive coupling between the control gate connected to WL29 and the floating gates coupled to WL28 and WL30. As WL29 is driven to V1, the capacitive coupling effect can increase the floating gate voltage, thereby increasing the probability of pass disturbance in the memory cells immediately adjacent to the selected memory cell. Therefore, the reduction of the wordline voltage to V3 will reduce the floating gate voltage.

In the embodiment shown in FIG. 22A the voltage levels of V1, V2 and V3 can be selected according to the following criteria. V1 should be a voltage level high enough to promote F-N tunneling in a memory cell coupled to a bitline biased to 0V. The voltage level of V2 should be selected to satisfy the following three criteria. First, V2 should be high enough to ensure that the channels of unselected cells are made to be conductive. Second, when the voltage V2 falls down to the voltage V3 for WL28 and WL30 during time period T4, the memory cells connected to WL28 and WL30 are turned off and remain turned-off during time period T4. This is the local decoupling effect that is achieved. Third, when the selected wordline WL29 rises to the program voltage V1 from voltage V2, the channel of the selected cell can be boosted to a desired voltage, namely to the secondary boosted voltage level. V3 should be a voltage level high enough to pass a 0V bitline voltage through unselected cells to the drain of a selected cell, while being sufficiently low to substantially turn off the channels of the memory cells (connected to WL28 and WL30) immediately adjacent the selected cell (connected to WL29).

The currently described program inhibit scheme can be modified for the presently described parallel multi-state programming embodiments, by varying the voltage applied to the bitlines prior to driving the wordlines during the program iteration. In the previously described program inhibit embodiment, the application of a program inhibit voltage of VCC minimizes the electric field strength between the selected word line driven to V1 and the channel of the selected cell when the bit line is biased to VCC. According to the present embodiments, by biasing the bitline to a voltage between VCC and VSS, this electrical field strength is increased relative to the full VCC inhibit situation, thereby allowing the threshold voltage of the cell to be shifted positively. However, the amount by which the threshold voltage shifts will be less than if the bitline was biased to VSS. Therefore, the cell is partially inhibited from being fully programmed.

Figure 23:
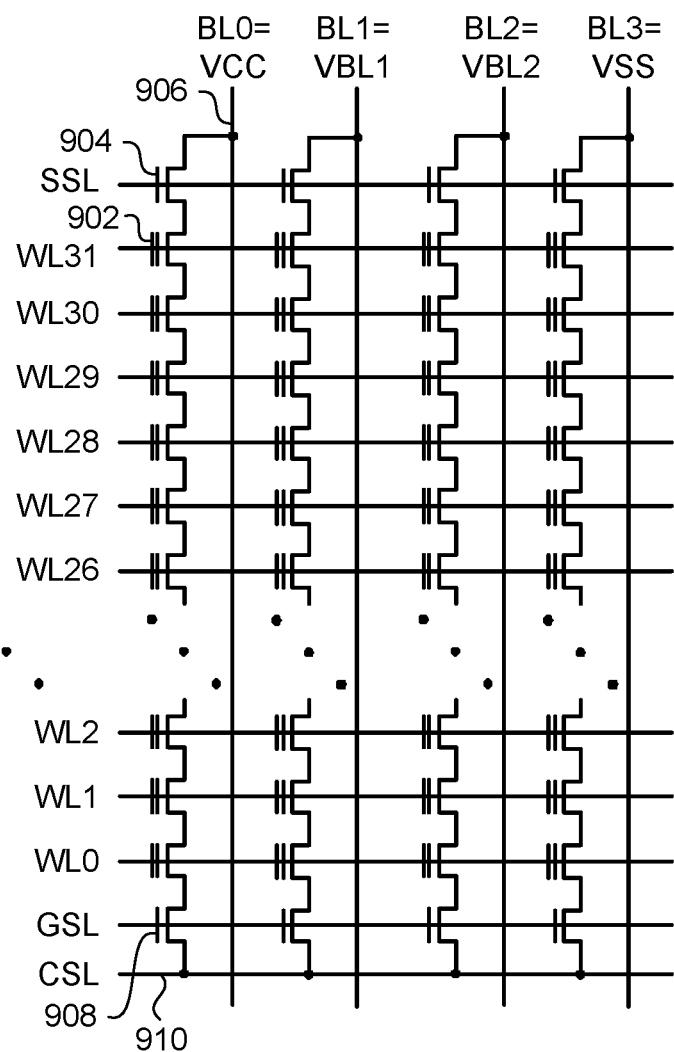
FIG. 23 is a circuit schematic showing example voltage biasing of bitlines for parallel multi-state programming, according to a present embodiment.

FIG. 23 is a circuit schematic of four flash memory NAND cell strings showing example voltage biasing of the bitlines for a parallel multi-state programming embodiment for a two-bit per cell storage scheme. The elements of the NAND cell strings shown in FIG. 23 have been previously described for the NAND cell string previously shown in FIG. 22A, and therefore use the same reference numbers to designate the same elements. Each of the NAND cell strings is connected to a respective bitline, BL0, BL1, BL2 and BL3. In the presently shown example, BL0 is biased to VCC, BL1 is biased to VBL1, BL2 is biased to VBL3 and BL3 is biased to VSS. According to the present embodiments, all the bitlines are biased with one of these four voltages at the same time prior to the wordlines being driven. Then the wordlines are driven for effecting programming, such as with the voltages and with the sequence outlined in FIG. 22B for the described program inhibit scheme. Other program inhibit schemes operating under the principle where one voltage is used for inhibiting programming and another is used for enabling programming can be adapted for parallel multi-state programming as taught by the present embodiments.

In one example of a two-bit per cell storage scheme, the bitlines can be biased to one of the program inhibit voltage of VCC, and program voltages VSS, VBL1 and VBL2, where VBL1 and VBL2 are both greater than VSS and less than VCC. For example, VBL1 can be 1 Volt and VBL2 can be 2 Volts. The specific voltage levels for VBL1 and VBL2 can be determined based on factors such as the manufacturing process, the desired threshold voltage, and the programming profile for the selected wordline. The same principles described above can be applied to embodiments where more than two bits are to be stored in a memory cell.

Figure 24:
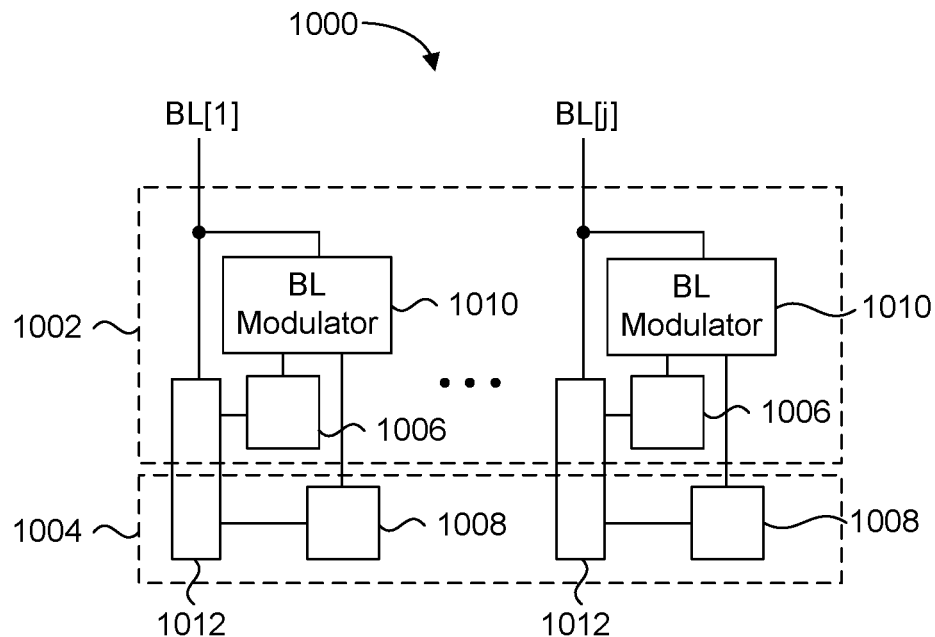
FIG. 24 is a block diagram of bitline access circuitry for parallel multi-state programming, according to a present embodiment.

The biasing of the bitlines to a particular voltage level depends on the logic states of the bits of the pages of data corresponding to a specific bitline. FIG. 24 is a block diagram of bitline access circuitry for modulating the bitline voltage levels for parallel multi-state programming, according to a present embodiment. Bitline access circuitry 1000 includes a page buffer 1002, and at least one multi-page program buffer 1004. Page buffer 1002 includes a plurality of data storage circuits 1006, each for storing 1 bit of a first page of data. Page buffer 1004 includes a plurality of data storage circuits 1008 each for storing 1 bit of a second page of data. Each pairing of data storage circuits 1006 and 1008 connected to BL modulator 1010 are associated with a respective bitline. The data decoding circuitry for each bitline includes BL modulator 1010 and a data verify decoder 1012. Elements 1002, 1006, 1008 and 1012 are substantially the same as elements 112, 114, 504, 502 and 506 shown in FIG. 16. The main difference between the embodiments of FIG. 24 and FIG. 16 is BL modulator 1010, which is responsible for decoding the data bits of the two pages of data associated with a particular bitline and biasing the bitline with a predetermined voltage, and decoding logic of data verify decoder 1012. Every BL modulator 1010 in the memory array biases its respective bitline at the same time, before the program iteration is initiated.

Figure 25:
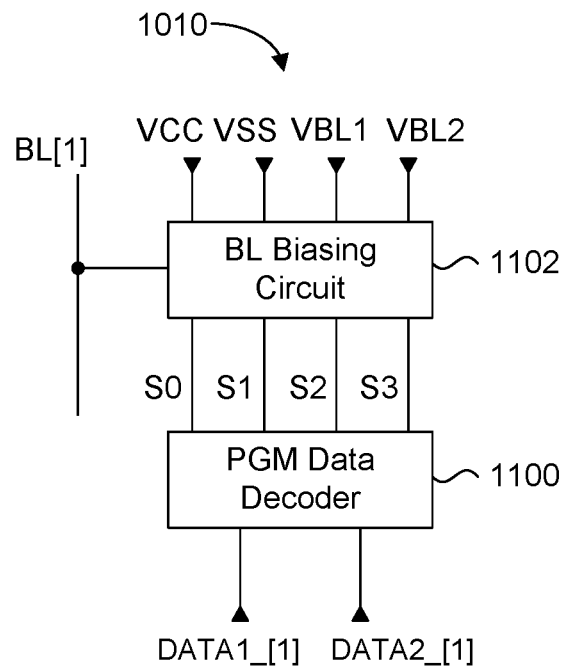
FIG. 25 is a schematic showing the functional blocks of the bitline modulator shown in FIG. 24, according to a present embodiment.

FIG. 25 is a schematic showing the functional blocks of BL modulator 1010. BL modulator 1010 includes a program data decoder 1100 and a bitline biasing circuit 1102. The program data decoder 1100 receives a bit of data from a first page buffer, referred to as DATA1_[1] and a bit of data from a second page buffer referred to as DATA2_[1]. The "DATA1" term indicates that the bit is from the first page buffer, while the "DATA2" term indicates that the bit is from the second page buffer. The "[1]" term indicates the bit position in the page of data. The program data decoder 1100 decodes the two bits of data to provide selection signals S0, S1, S2 and S3, where only one is at the active logic level for any combination of DATA1_[1] and DATA2_[1]. These selection signals are used by bitline biasing circuit 1102 for passing one of predetermined voltages VCC, VSS, VBL1 or VBL2 to the bitline BL[1], where VCC>VBL2>VBL1>VSS. In the present embodiment, each selection signal is mapped to a corresponding predetermined voltage. The presently shown embodiment is configured for a two-bit per cell storage scheme, which can be scaled for three-bit or more per cell storage schemes. Therefore, for each possible combination of DATA1_[1] and DATA2_[1], BL modulator 1010 selects and biases its bitline to one of predetermined voltages VCC, VSS, VBL1 or VBL2. The voltages can be generated by voltage generators.

Figure 26:
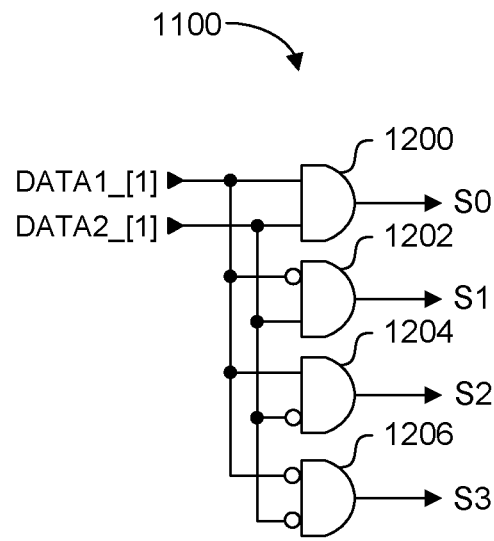
FIG. 26 is a circuit schematic embodiment of the program data decoder shown in FIG. 25, according to a present embodiment.

FIG. 26 is an example circuit schematic illustrating an embodiment of the program data decoder 1100 shown in FIG. 25. The program data decoder 1100 includes AND logic gates 1200, 1202, 1204 and 1206 each having a first input and a second input for receiving page buffer data bits DATA1_[1] and DATA2_[1]. Each AND logic gate provides one of selection signals S0, S1, S2 and S3. The first and second inputs of the AND logic gates are configured differently so as to ensure that only one of the selection signals is driven to the active high logic level for any combination of DATA1_[1] and DATA2_[1]. The example logic gate configuration shown in FIG. 26 is one possible configuration which could be used. Different types of logic gates and input configurations can be used to obtain the same result shown by the AND logic gate configuration shown in FIG. 26, which is to select a specific voltage for application to the bitline.

Figure 27:
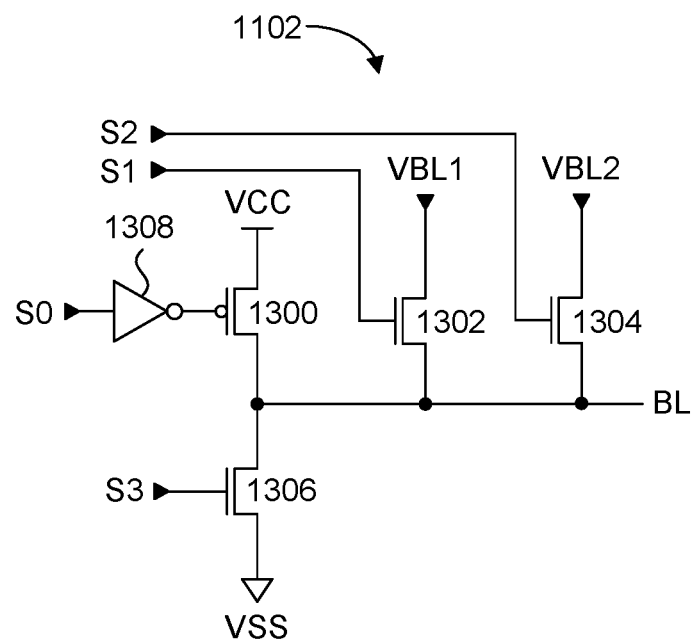
FIG. 27 is a circuit schematic embodiment of the bitline biasing circuit shown in FIG. 25.

FIG. 27 is an example circuit schematic illustrating an embodiment of the bitline biasing circuit 1102 shown in FIG. 25. Bitline biasing circuit 1102 includes p-channel transistor 1300, and n-channel transistors 1302, 1304 and 1306. P-channel transistor 1300 connects the bitline BL to VCC in response to S0 at the high logic level, via inverter 1308. N-channel transistor 1302 connects the bitline BL to VBL1 in response to S1 at the high logic level. N-channel transistor 1304 connects the bitline BL to VBL2 in response to S2 at the high logic level. N-channel transistor 1306 connects the bitline BL to VSS in response to S3 at the high logic level. Accordingly, through the selection signals S0, S1, S2 and S3 provided by program data decoder 1100, one of the predetermined voltages can be applied to the bitline BL. Different circuit configurations can be used to provide the different voltages to the bitline in response to the selection signals.

The circuit embodiment shown in FIG. 26 can be used for the parallel multi-state programming embodiment of FIG. 18A, but a modified version of the circuit would be used for the mixed sequential and parallel multi-page program embodiment of FIG. 19A, according to another embodiment. In such an alternate embodiment, the logic of program data decoder 1100 would be configured such that in the first programming iteration for programming state ST1, any memory cell designated for storing states ST2 or ST3 will have its respective bit lines biased to the same bitline voltage corresponding to ST1, which in the present example is VBL1. This can be done by designing logic circuits to achieve this desired result, or alternately, the transistors 1304 and 1306 of bitline biasing circuit 1102 can be configured to receive VBL1 instead of VBL2 and VSS respectively, in the first programming iteration. In the next programming iteration for programming states ST2 and ST 3 in parallel, the circuit of FIG. 26 can be used in the previously described manner.

The mixed sequential and parallel multi-page program embodiment of FIG. 20A would require a similar modification to the logic of program data decoder 1100. In this case, states ST1 and ST2 are programmed in the first program iteration. However, memory cells designated for storing state ST3 should be programmed to the intermediate ST2 state in the first program iteration. Therefore, the logic of program data decoder 1100 would be configured such that in the first programming iteration for programming ST1 and ST2, any memory cell designated for storing state ST3 will have its respective bit line biased to the same bitline voltage corresponding to ST2, which in the present example is VBL2. Once again logic decoding circuit can be designed to achieve this desired result, or alternatively, voltage level switching for bitline biasing circuit 1102 can be used.

The presently described embodiments of the bitline access circuitry 1000 can be used for executing the full parallel multi-state programming embodiment shown in FIG. 18A where all the possible states are programmed simultaneously. For the embodiments of FIGS. 19A and 20A in which parallel multi-state programming is executed for some states either before or after another programming iteration in which one other state is programmed, the previously described embodiments of the bit line access circuitry 1000 can be modified in accordance with the teachings of the embodiments of FIG. 16 and FIG. 17. Such modifications adapt the circuits for program verification operations unique to the full parallel multi-state programming embodiment shown in FIG. 18A and to the mixed sequential and parallel multi-page program embodiments shown in FIG. 19A and FIG. 20A. Following is a discussion of program verification for the presently described multi-state programming embodiments.

In the previously described embodiments where one state is programmed in each programming iteration, a program verification operation is executed after each iteration to ensure that the desired threshold voltage has been properly programmed to the memory cells. For the presently described multi-state programming embodiments, at least 2 states are programmed simultaneously in one programming iteration. Therefore, a new program verify scheme is used for verifying that the threshold voltages corresponding to the at least 2 states have been programmed to their respective cells.

For the embodiment of FIG. 18A, although all the states are programmed in parallel, program verification is executed sequentially for each state. In the present embodiments, when the memory cell connected to a bitline has been verified as being successfully programmed, the 2 data buffer bits corresponding to that bitline are changed to binary values "11" corresponding to the erased state for inhibiting further programming. However, only the data buffer bits for the programmed state being verified should be subjected to being toggled to the erased state. Stated differently, the data buffer bits for the state not being verified should not be toggled to the erased state during the program verify operation for another programmed state. As previously described for the embodiment of FIG. 16, data verify decoder 506 toggles the data buffer register bits in the program verify operations. Therefore this circuit should be enabled for those bit lines biased during programming to a state for which a program verify operation is currently being executed.

Figure 28:
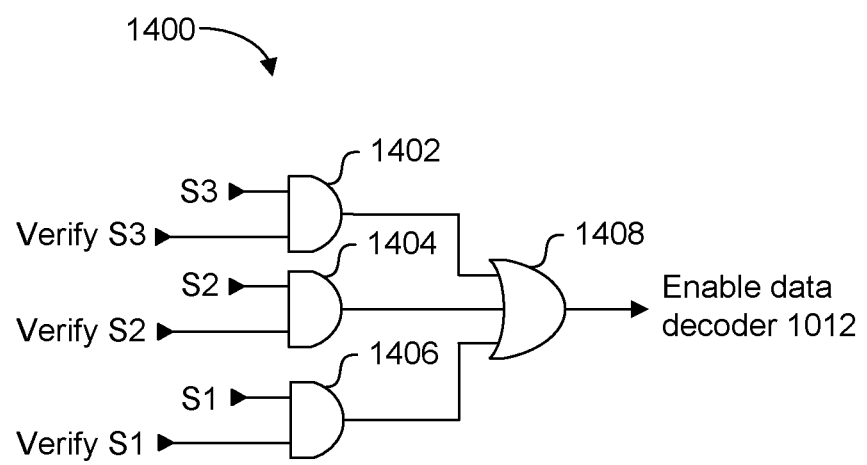
FIG. 28 is a circuit schematic embodiment of a control circuit for the multi-state programming embodiment of FIG. 18A; and, FIG. 29 is a flowchart outlining a method for parallel multi-state programming, according to a present embodiment.

FIG. 28 shows a circuit schematic embodiment of a control circuit for selectively enabling or disabling a data verify decoder 1012 of the embodiment of FIG. 24, for the multi-state programming embodiment of FIG. 18A. Program verify control circuit 1400 includes AND logic gates 1402, 1404 and 1406, and an OR logic gate 1408. Each AND logic gate has a first input for receiving one of the selection signals S1, S2 or S3 provided by program data decoder 1100 shown in FIG. 26. Each AND logic gate has a second input for receiving verify control signals Verify S1, Verify S2 and Verify S3 corresponding to selection signals S1, S2 and S3 respectively. The outputs of AND logic gates 1402, 1404 and 1406 are logically OR'd together by gate 1408 to provide an output for enabling its corresponding data verify decoder 1012. It is noted that no AND logic gate is required for state S0, since state S0 is the erased state which does not need to be program verified. It is assumed that data verify decoder 1012 is configured to be responsive to the enable signal from program verify control circuit 1400.

In operation, program verify control circuit 1400 receives verify control signals Verify S1, Verify S2 and Verify S3 at the active high logic level at different periods, wherein each period corresponds to a program verification operation for a specific state. For example, Verify S1 can be first asserted for verifying state S1, followed by Verify S2 for verifying state S2. As previously discussed, program data decoder 1100 asserts only one of selection signals S0, S1, S2 and S3 for any given logic state combination of DATA1_[1] and DATA2_[1]. Therefore as each verify control signal Verify S1, Verify S2 and Verify S3 is asserted for verifying a specific state, only the data verify decoders 1012 associated with bitlines biased for programming that specific state are enabled, and all other data verify decoders 1012 are disabled. The specific logic gate configuration shown in FIG. 28 is an example of one possible configuration. Alternate logic gate configurations can be used for enabling data decoder 1012 using the selection signals in combination with other control signals in order to achieve the same result.

Once enabled, the data verify decoders 1012 are configured for toggling the pair of data bits of the page buffers corresponding to the bitline, to the erased state if programming of that specific state has been deemed to be successful. Otherwise, the pair of data bits are unchanged. Hence, unsuccessfully programmed memory cells will have their corresponding bit lines biased to the specific voltage level selected by selection signals S1, S2 and S3 for re-programming. In the present embodiment, data verify decoder 1012 includes logic circuitry configured to toggle the pair of data bits corresponding to states ST1, ST2 and ST3 to logic levels corresponding to the erased state, such as "11" for example.

Now that the technique for program verification of the parallel multi-state programming embodiment has been described, it is noted that the program verify technique for the mixed sequential and parallel multi-page programming embodiments of FIG. 19A and FIG. 20A combines the program verify embodiment used in the sequential programming embodiment of FIG. 16 and the program verify embodiment for the parallel multi-state programming embodiment of FIG. 22.

Starting with the embodiment of FIG. 19A, the first state to be programmed is state ST1, followed by parallel programming of states ST2 and ST3. However, the memory cells designated for storing states ST2 and ST3 are programmed in the first programming iteration and therefore store state ST1 as an intermediate state. This first programming iteration is similar to the one shown in FIG. 14B where all the cells are programmed to store state ST1 either as a final state or as an intermediate state. Therefore the previously described program verify technique for FIG. 14B can be used. In the next programming iteration, the intermediate states are shifted to final states. Therefore as part of a successful program verify operation for the first programming iteration, logic circuitry of data verify decoder 1012 is configured to i) toggle the data bits corresponding to state ST1 to the erased state; or ii) toggle the data bits corresponding to state ST2 to a combination for selecting bitline voltage VBL2; or iii) toggle the data bits corresponding to state ST3 to a combination for selecting bitline voltage VSS. The bit lines are therefore biased to new voltage levels for the second programming iteration to program states ST2 and ST3 in parallel. The program verify technique employed for the embodiment of FIG. 18A can be used for the second programming iteration.

For the embodiment of FIG. 20A, states ST1 and ST2 are programmed in parallel in a first programming iteration, followed by programming of state ST3 in a second programming iteration. For the first program iteration, the program verify technique described for the embodiment of FIG. 18A can be used. As part of a successful program verify operation for the first programming iteration, the logic circuitry of data verify decoder 1012 is configured to i) toggle the data bits corresponding to state ST1 or ST2 to the erased state; or ii) toggle the data bits corresponding to state ST3 to a combination for selecting bitline voltage VSS. The bit lines are therefore biased to new voltage levels for the second programming iteration to program state ST3. The program verify technique employed for the embodiment of FIG. 14B can be used for the second programming iteration.

The previously disclosed and described circuits and logic configurations are presented as examples of embodiments which could be used for implementing the different multi-state programming embodiments and corresponding program verify embodiments. Alternate circuits and logic configurations can be used to obtain the same desired result.

Figure 29:
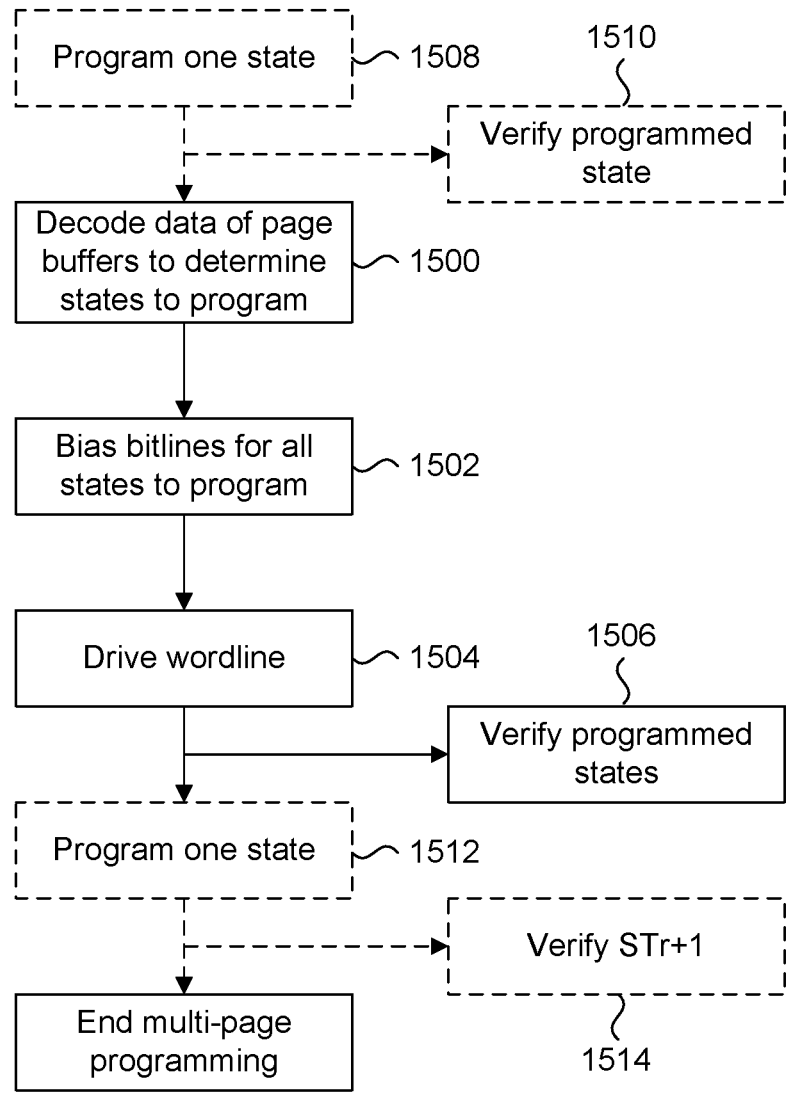

FIG. 29 is a flowchart outlining a method for parallel multi-state programming, according to a present embodiment. This method can be used in block 302 of the method of FIG. 9. The method of FIG. 28 starts at 1500 by decoding the bits of the pages of data corresponding to each bitline, as described in the previously disclosed circuit embodiments, for determining the states to program. At 1502, the bit lines are biased to voltage levels corresponding to each of the different states to program. Once the bit lines are biased to their respective voltage levels, a selected word line is driven at 1504 with a programming profile for simultaneous programming of the different states to the memory cells, where each different state has a corresponding threshold voltage. Once programming is complete, a program verify operation according to the previously described embodiments, can be executed at 1506. Elements 1500, 1502, 1504 and 1506 can be used for full parallel multi-state programming of all possible states, or for parallel multi-state programming of a subset of all possible states.

For example, prior to decoding data at 1500 a first programming iteration can be executed at 1508 for programming one state with the corresponding program verify operation at 1510, thereby leaving the remaining possible states to be programmed in parallel at 1500, 1502 and 1504 (the second programming iteration). The programming operation executed at 1500, 1502, 1504 and 1506 can be used for programming all the possible states except for one state as a first programming iteration. The remaining state can be programmed in a second programming iteration 1512, with the corresponding program verify operation at 1514. The presently described embodiments are not limited to programming one state in a first programming iteration followed by programming remaining states in parallel in a second program iteration, or vice versa. In the situation where there are many states to be programmed, multiple programming iterations can be used where at least 2 states are programmed in each programming iteration.

In the embodiments described above, the device elements and circuits are connected to each other as shown in the figures, for the sake of simplicity. In practical applications of the present invention, elements, circuits, etc. may be connected directly to each other. As well, elements, circuits etc. may be connected indirectly to each other through other elements, circuits, etc., necessary for operation of devices and apparatus. Thus, in actual configuration, the circuit elements and circuits are directly or indirectly coupled with or connected to each other.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A NAND flash memory device comprising:
a plurality of I/O ports configured to receive a single multi-page program request from a memory controller, the single multi-page program request comprising at least two iterative command and data input sequences, each command and data input sequence comprising command data, address data and write data;
a ready/busy port configured to output a ready/busy signal indicating a busy status of the NAND flash memory device, the ready/busy signal indicates a busy status in between the at least two iterative command and data input sequences;
a flash memory array comprising NAND type memory cells connected to wordlines and coupled to bitlines, each wordline corresponding to a single physical page comprising M logical pages, M being an integer greater than 1;
bitline access circuitry configured to store M logical pages of data before execution of a single multi-page programming cycle, and bias the bitlines to one of enable and inhibit programming for each of $2^M-1$ programming iterations based on a combination of bits corresponding to each bitline from the M logical pages of data during execution of the single multi-page programming cycle, each logical page of data being provided from the write data; and
row circuits configured to drive a selected wordline with different time periods for each of the $2^M-1$ programming iterations while the bitlines are biased to enable or inhibit programming based on a combination of logic states of the M logical pages of data, and program the M logical pages of data to a single physical page of memory cells in the single multi-page programming cycle.

2. The NAND flash memory device of claim 1, wherein the command data includes a data load command.

3. The NAND flash memory device of claim 1, wherein the command data includes a data end command.

4. The NAND flash memory device of claim 1, wherein the command data of the last command and data input sequence includes a multi-page program start command.

5. The NAND flash memory device of claim 4, wherein the ready/busy port is further configured to output a ready/busy signal indicating another busy status after the multi-page program start command.

6. The NAND flash memory device of claim 1, wherein the address data includes address information for selecting a logical page within the single physical page.

7. The NAND flash memory device of claim 6, wherein the address data of the first command and data input sequence includes a lower page address within the single physical page.

8. The NAND flash memory device of claim 6, wherein the address data of the last command and data input sequence includes an upper page address within the single physical page.

9. The NAND flash memory device of claim 1, wherein the bitline access circuitry includes M data buffers each for storing one of the M logical pages of data.

10. The NAND flash memory device of claim 9, wherein the bitline access circuitry comprises bitline biasing circuitry configured to bias each of the bitlines to one of enable and inhibit programming based on the combination of bits of the M logical pages of data stored in the M data buffers that correspond to each bitline.

11. The NAND flash memory device of claim 10, wherein each of the M data buffers comprises data storage circuits configured to store one bit of a logical page of data.

12. The NAND flash memory device of claim 11, wherein each bit position of the M data buffers comprises:
a data verify decoder configured to receive the bits of the M pages of data stored in the M data buffers that correspond to each bitline; and
inversion circuitry configured to invert the bits in response to selected outputs of the data decoder.

13. The NAND flash memory device of claim 1, wherein each of the different time periods increases in time for each successive programming iteration.

* * * * *